(12) United States Patent
Rottenberg et al.

(10) Patent No.: US 8,003,537 B2
(45) Date of Patent: Aug. 23, 2011

(54) METHOD FOR THE PRODUCTION OF PLANAR STRUCTURES

(75) Inventors: Xavier Rottenberg, Schaarbeek (BE); Phillip Ekkels, Enschede (NL); Hendrikus Tilmans, Maasmechelen (BE); Walter De Raedt, Lint (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 28 days.

(21) Appl. No.: 11/779,794

(22) Filed: Jul. 18, 2007

(65) Prior Publication Data
US 2008/0038916 A1 Feb. 14, 2008

Related U.S. Application Data

(60) Provisional application No. 60/831,957, filed on Jul. 18, 2006.

(51) Int. Cl.
*H01L 21/302* (2006.01)
(52) U.S. Cl. ........ 438/690; 257/415; 257/416; 257/417; 257/418; 257/532; 438/619; 438/689; 438/691; 438/692; 438/693; 430/322; 430/323; 430/324
(58) Field of Classification Search .................. 438/690
See application file for complete search history.

(56) References Cited

U.S. PATENT DOCUMENTS

| | | | | |
|---|---|---|---|---|
| 4,158,079 A | * | 6/1979 | Severus-Laubenfeld | 428/172 |
| 4,426,437 A | * | 1/1984 | Fisch et al. | 430/166 |
| 5,254,439 A | * | 10/1993 | Tani et al. | 430/326 |
| 5,286,927 A | * | 2/1994 | Ueno et al. | 174/257 |
| 5,419,991 A | * | 5/1995 | Segawa | 430/20 |
| 5,427,649 A | * | 6/1995 | Kim et al. | 438/705 |
| 5,614,336 A | * | 3/1997 | Mikami et al. | 430/5 |
| 5,840,465 A | * | 11/1998 | Kakinuma et al. | 430/270.1 |
| 5,858,620 A | * | 1/1999 | Ishibashi et al. | 430/313 |
| 5,909,280 A | * | 6/1999 | Zavracky | 356/454 |
| 6,010,768 A | * | 1/2000 | Yasue et al. | 428/209 |
| 6,074,804 A | * | 6/2000 | Endo et al. | 430/322 |
| 6,331,378 B1 | * | 12/2001 | Endo | 430/314 |
| 6,350,706 B1 | * | 2/2002 | Howard | 438/781 |
| 6,352,813 B2 | * | 3/2002 | Nakano et al. | 430/280.1 |
| 6,780,781 B2 | * | 8/2004 | Odaka et al. | 438/717 |
| 6,806,925 B2 | * | 10/2004 | Ishii et al. | 349/106 |
| 7,002,439 B2 | * | 2/2006 | Rottenberg et al. | 333/262 |

(Continued)

OTHER PUBLICATIONS

Shen, Qin; Distributed MEMS Tunable Matching Network Using Minimal-Contact RF-MEMS Varactors; IEEE Transactions on Microwave Theory and Techniques, vol. 54, No. 6; Jun. 2006; 13 pages.

(Continued)

*Primary Examiner* — N Drew Richards
*Assistant Examiner* — Ankush K Singal
(74) *Attorney, Agent, or Firm* — Knobbe Martens Olson & Bear LLP

(57) ABSTRACT

A method for the production of a planar structure is disclosed. The method comprises producing on a substrate a plurality of structures of substantially equal height, and there being a space in between the plurality of structures. The method further comprises providing a fill layer of electromagnetic radiation curable material substantially filling the space between the structures. The method further comprises illuminating a portion of the fill layer with electromagnetic radiation, hereby producing a exposed portion and an unexposed portion, the portions being separated by an interface substantially parallel with the first main surface of the substrate. The method further comprises removing the portion above the interface.

36 Claims, 21 Drawing Sheets

U.S. PATENT DOCUMENTS

| | | | |
|---|---|---|---|
| 7,098,149 B2 * | 8/2006 | Lukas et al. | 438/778 |
| 7,116,462 B2 * | 10/2006 | Ikeda | 359/291 |
| 7,208,021 B1 * | 4/2007 | Vardosanidze et al. | 29/25.02 |
| 7,329,619 B2 * | 2/2008 | Kim et al. | 438/782 |
| 7,455,389 B2 * | 11/2008 | Nakamura et al. | 347/40 |
| 7,476,488 B2 * | 1/2009 | Saito | 430/270.1 |
| 7,615,338 B2 * | 11/2009 | Lee et al. | 430/322 |
| 7,678,460 B2 * | 3/2010 | Li et al. | 428/446 |
| 2001/0008741 A1 * | 7/2001 | Tomita et al. | 430/271.1 |
| 2001/0031425 A1 * | 10/2001 | Ito | 430/313 |
| 2002/0001978 A1 * | 1/2002 | Fleitz | 438/800 |
| 2002/0039809 A1 * | 4/2002 | Howard | 438/118 |
| 2002/0054252 A1 * | 5/2002 | Ishii et al. | 349/106 |
| 2002/0115293 A1 * | 8/2002 | Ghodsian | 438/689 |
| 2002/0198281 A1 * | 12/2002 | Dawes et al. | 522/113 |
| 2003/0008513 A1 * | 1/2003 | Howard | 438/694 |
| 2003/0129843 A1 | 7/2003 | Cai et al. | |
| 2004/0137728 A1 * | 7/2004 | Gallagher et al. | 438/689 |
| 2004/0147120 A1 * | 7/2004 | Rogalli et al. | 438/689 |
| 2004/0185348 A1 * | 9/2004 | Progler | 430/5 |
| 2004/0213563 A1 * | 10/2004 | Irie | 396/611 |
| 2004/0239006 A1 * | 12/2004 | Hong | 264/400 |
| 2005/0037143 A1 * | 2/2005 | Chou et al. | 427/248.1 |
| 2005/0037604 A1 * | 2/2005 | Babich et al. | 438/619 |
| 2005/0124712 A1 * | 6/2005 | Anderson et al. | 522/1 |
| 2005/0134768 A1 * | 6/2005 | Sugiura et al. | 349/113 |
| 2005/0181593 A1 * | 8/2005 | Leu et al. | 438/619 |
| 2006/0046446 A1 * | 3/2006 | Kon et al. | 438/579 |
| 2006/0134565 A1 * | 6/2006 | Yang | 430/394 |
| 2006/0138663 A1 * | 6/2006 | Clarke et al. | 257/758 |
| 2007/0031760 A1 * | 2/2007 | Chang et al. | 430/311 |
| 2007/0042611 A1 * | 2/2007 | McMonagle | 438/780 |
| 2007/0082496 A1 * | 4/2007 | Orii et al. | 438/737 |
| 2007/0238037 A1 * | 10/2007 | Wuister et al. | 430/22 |
| 2007/0264481 A1 * | 11/2007 | DeSimone et al. | 428/220 |
| 2007/0264794 A1 * | 11/2007 | Li | 438/439 |
| 2007/0282030 A1 * | 12/2007 | Anderson et al. | 522/1 |
| 2008/0007836 A1 * | 1/2008 | Lu et al. | 359/619 |

OTHER PUBLICATIONS

Rottenberg, Xavier; PowerPoint slides sent by email to 4 members of his PhD commission in Dec. 2004, and presented to the PhD commission in Jan. 2005, 5 pages.

Rottenberg, et al., Novel RF-MEMS capacitive switching structures, Proc. 32$^{nd}$ European Microwave Conference, p. 809-812, Milan Italy, Sep. 2002.

* cited by examiner

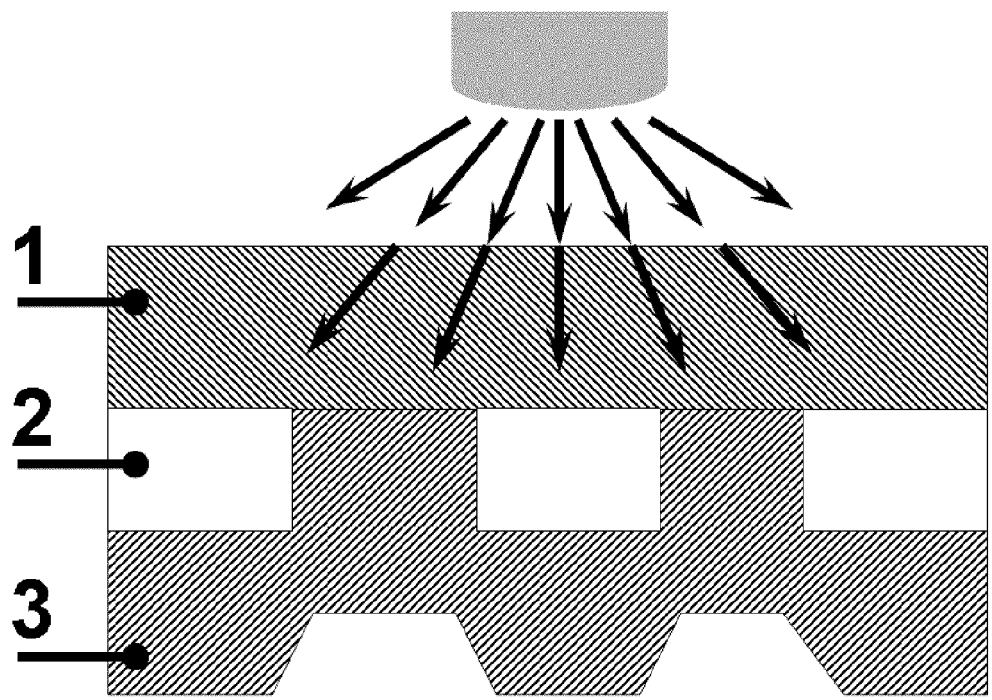
Fig.5D1
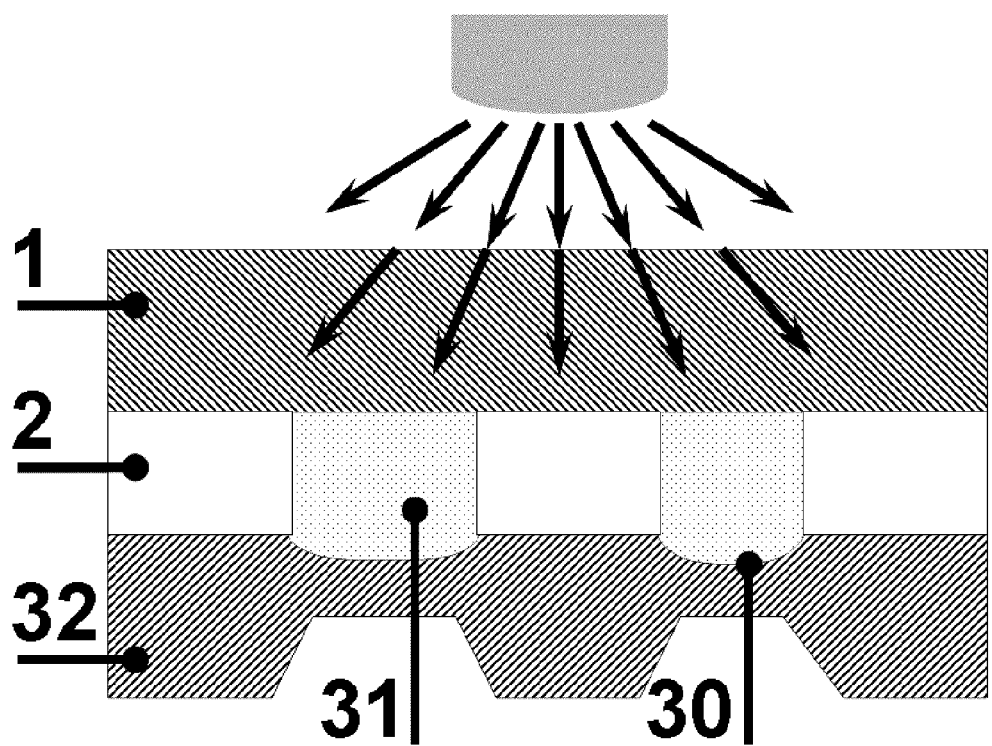
Fig. 5D2

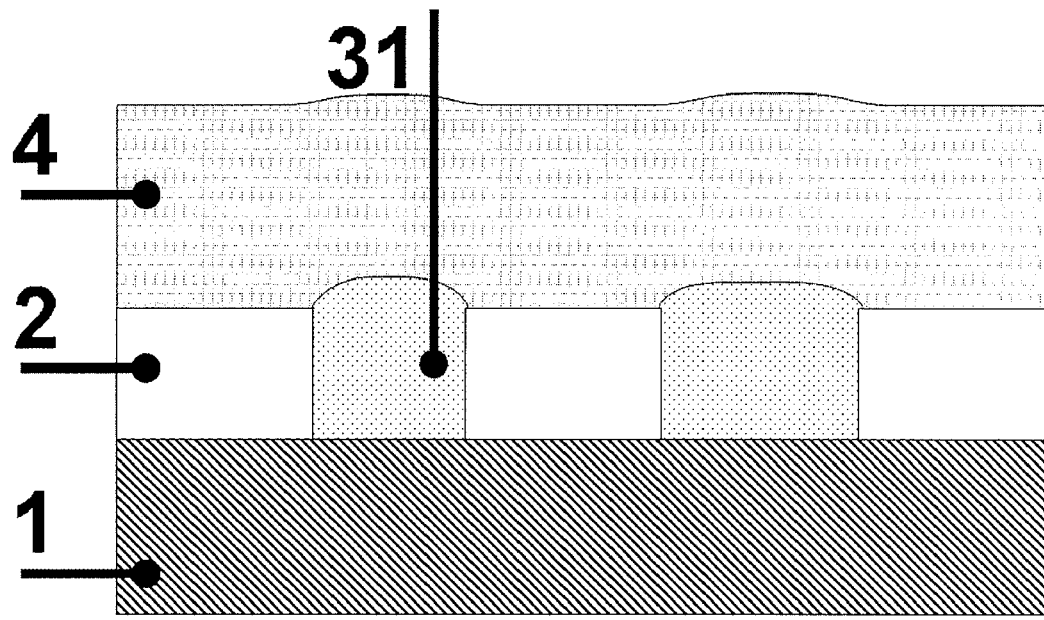
Fig.5G
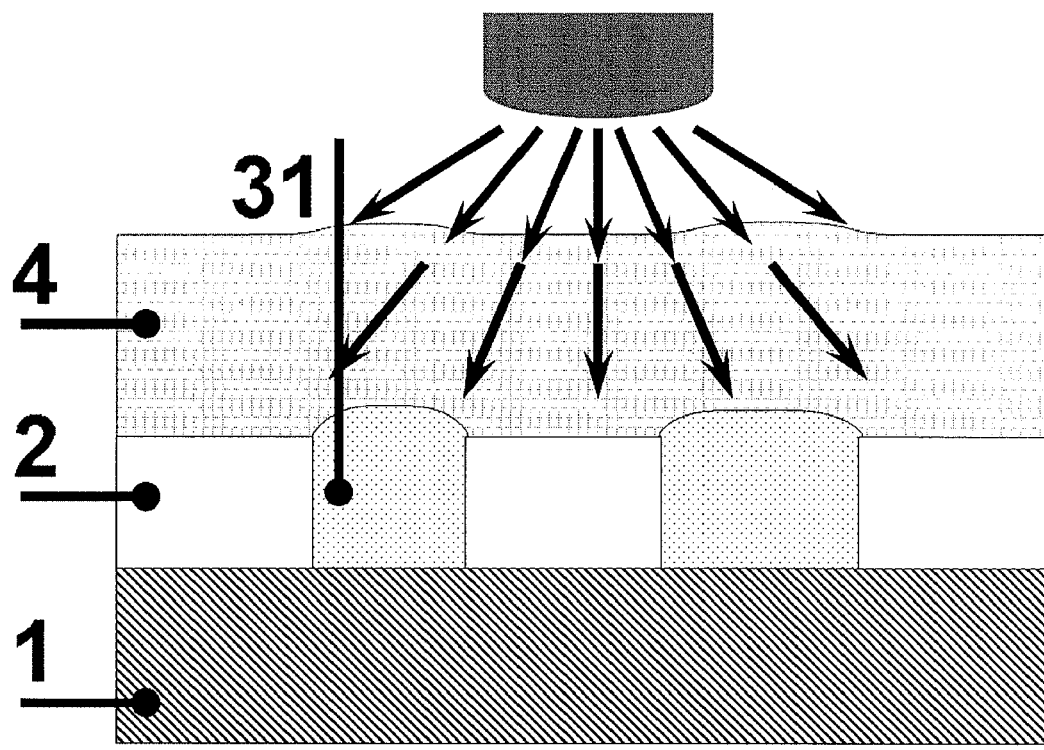
Fig.5H1

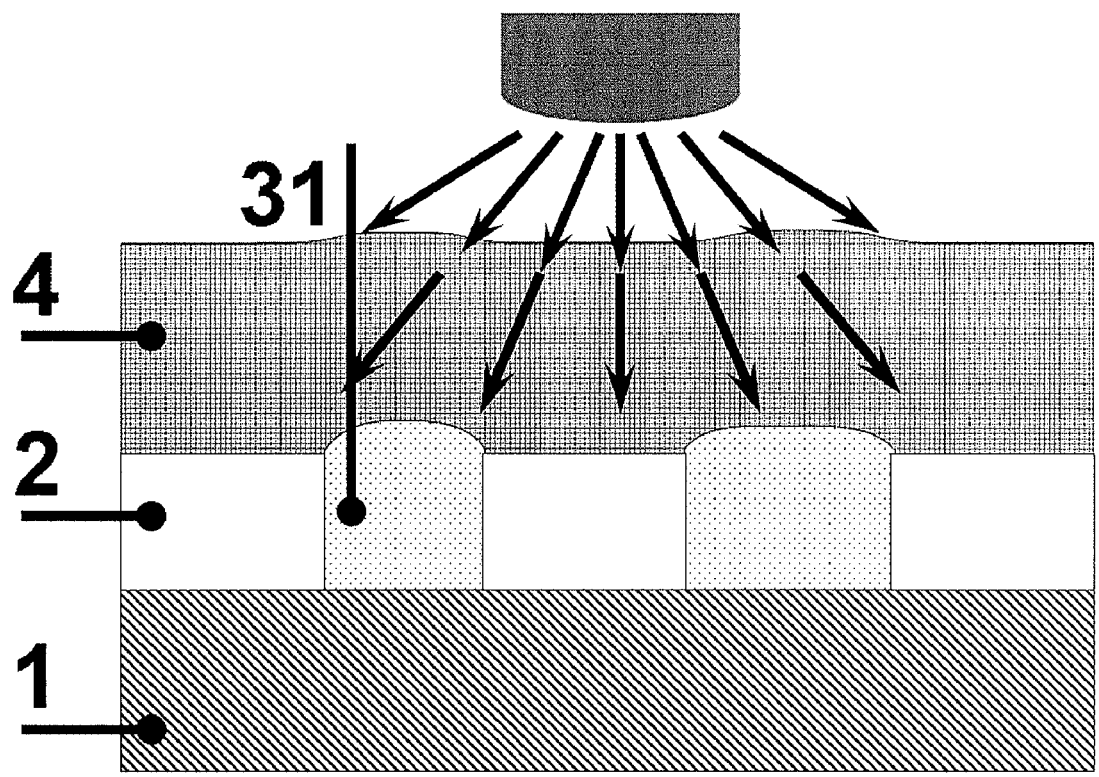
Fig.5H2
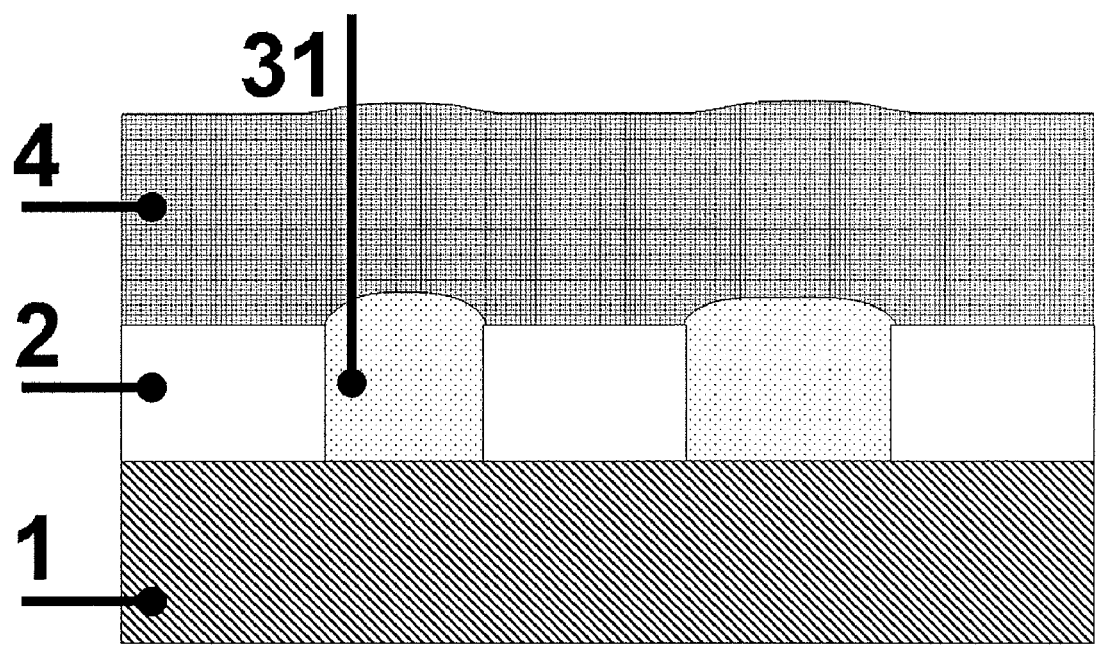
Fig.5H3

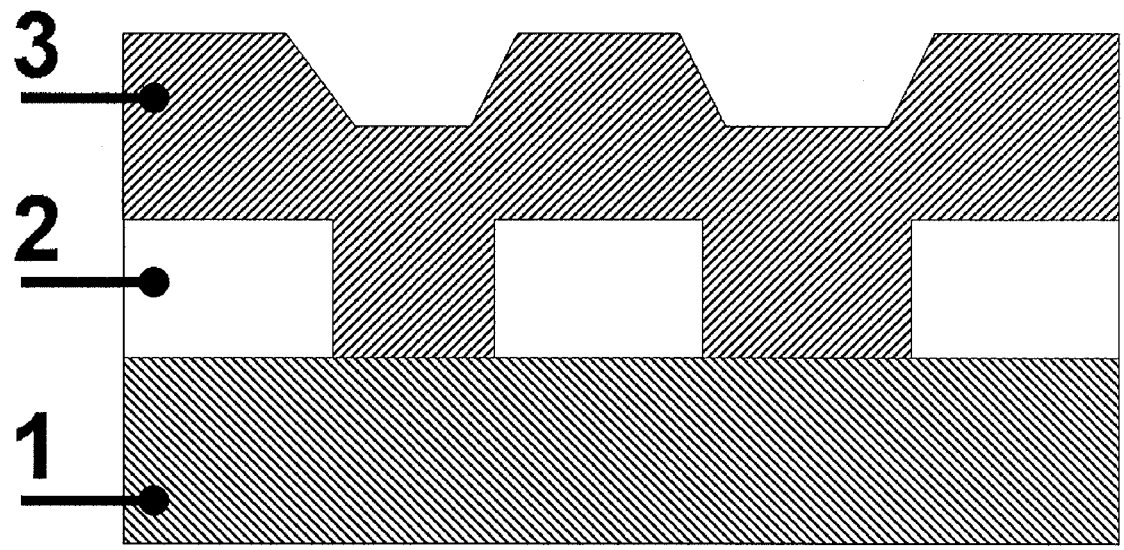
Fig.9B
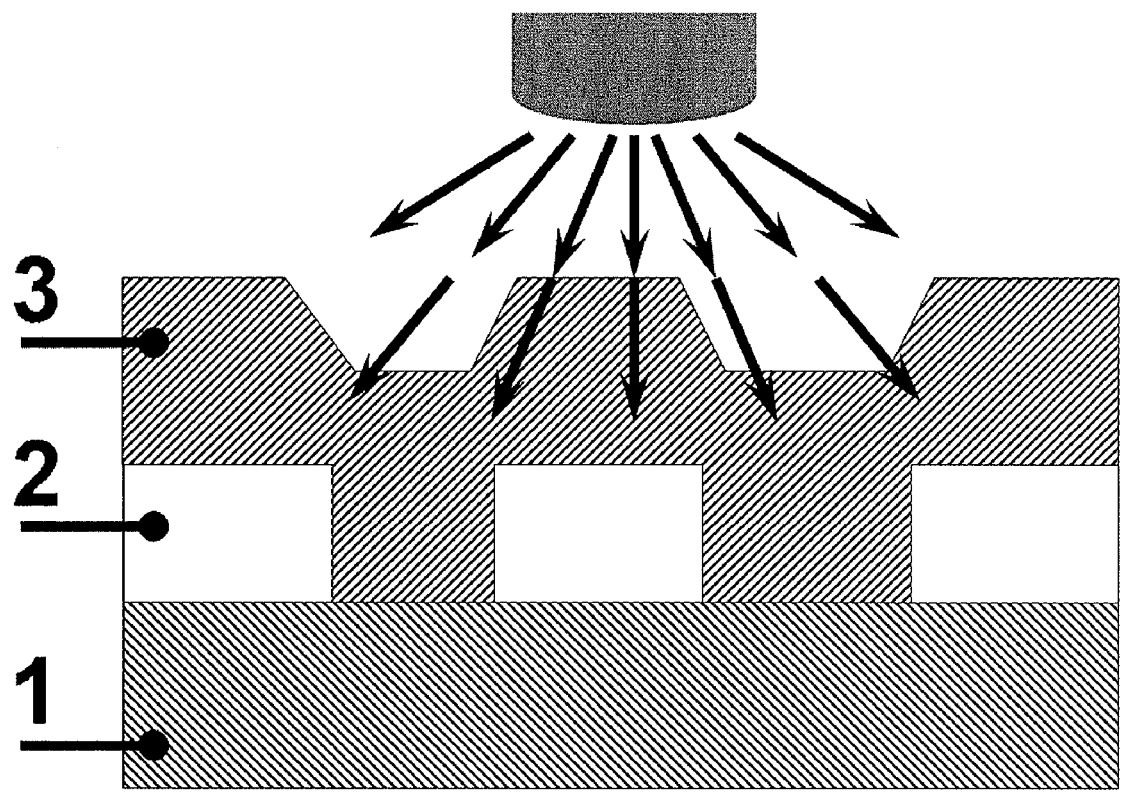
Fig.9C1

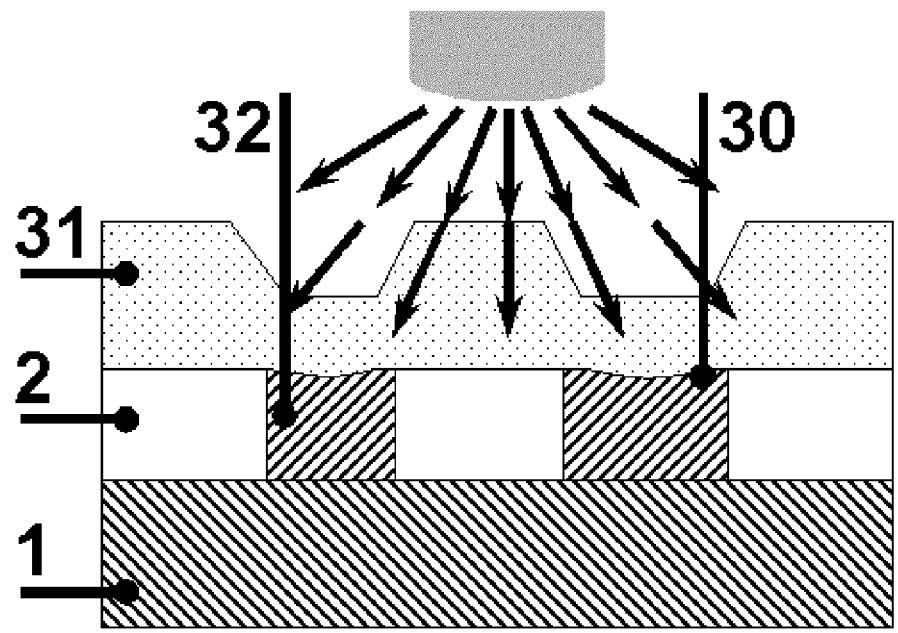
Fig. 9C2
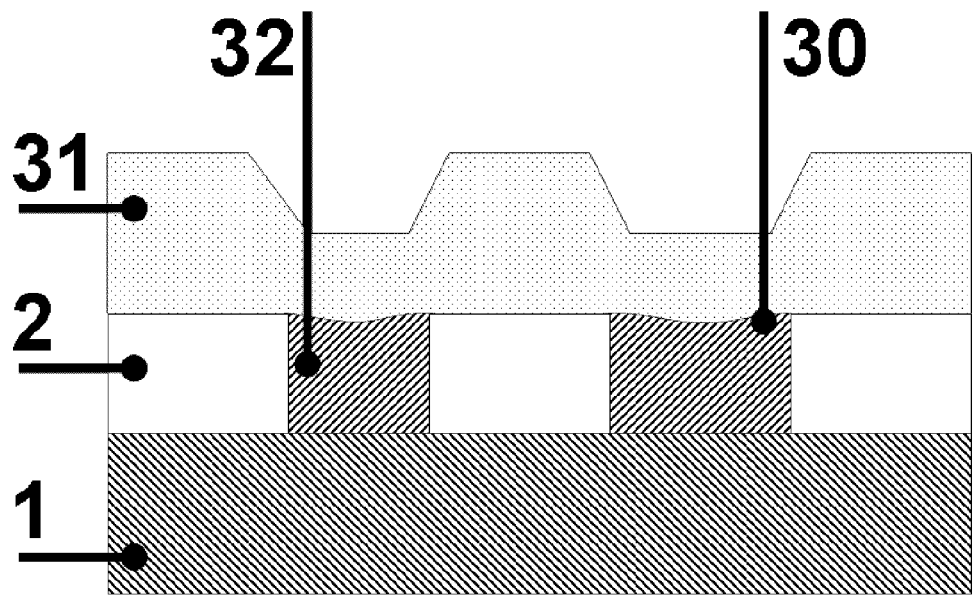
Fig. 9C3

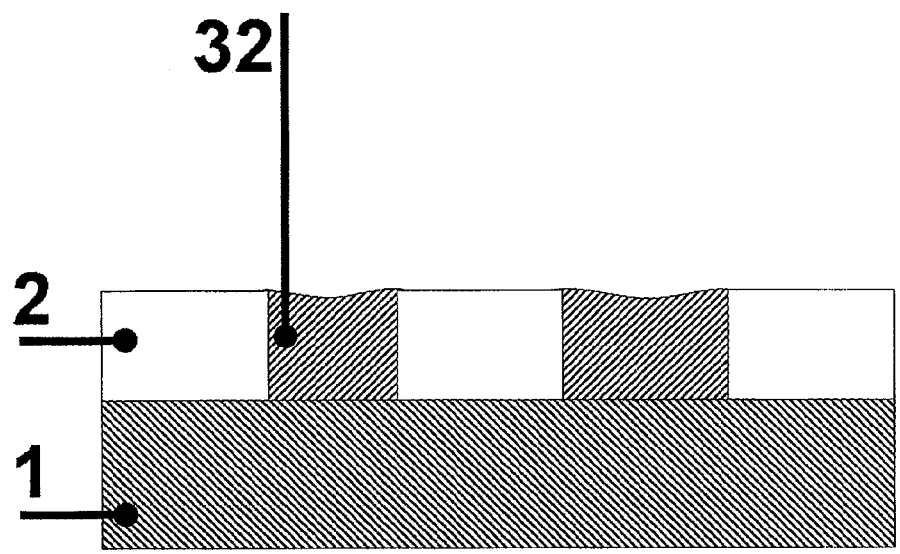
Fig.9D
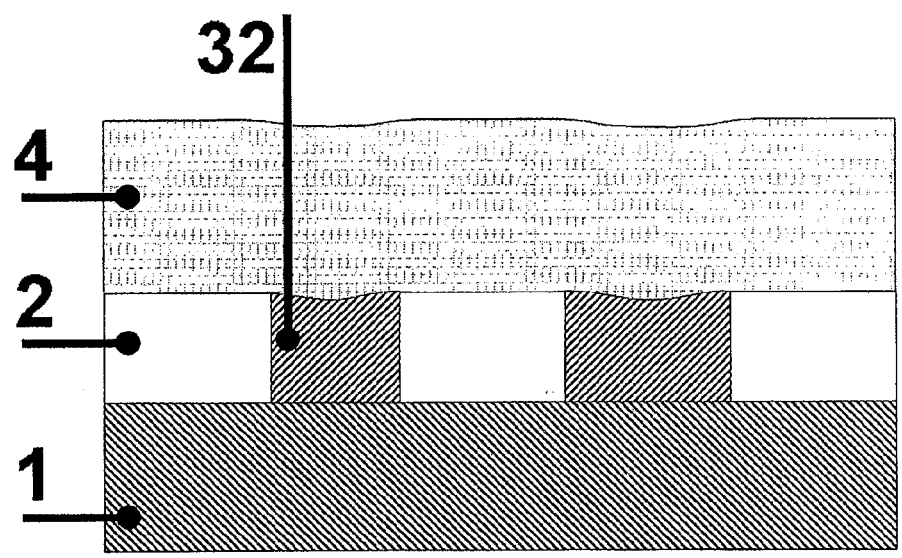
Fig.9E1

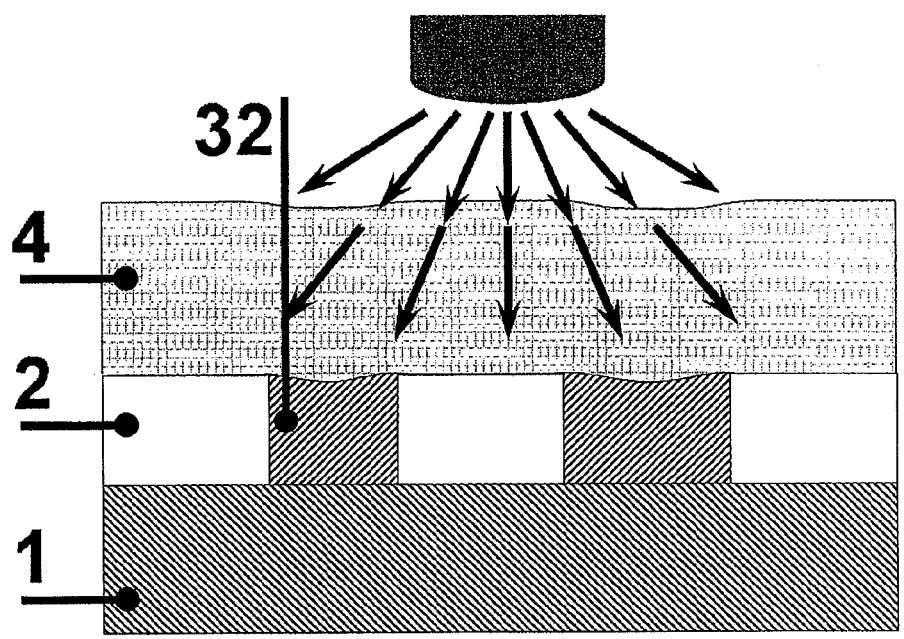
Fig.9E2
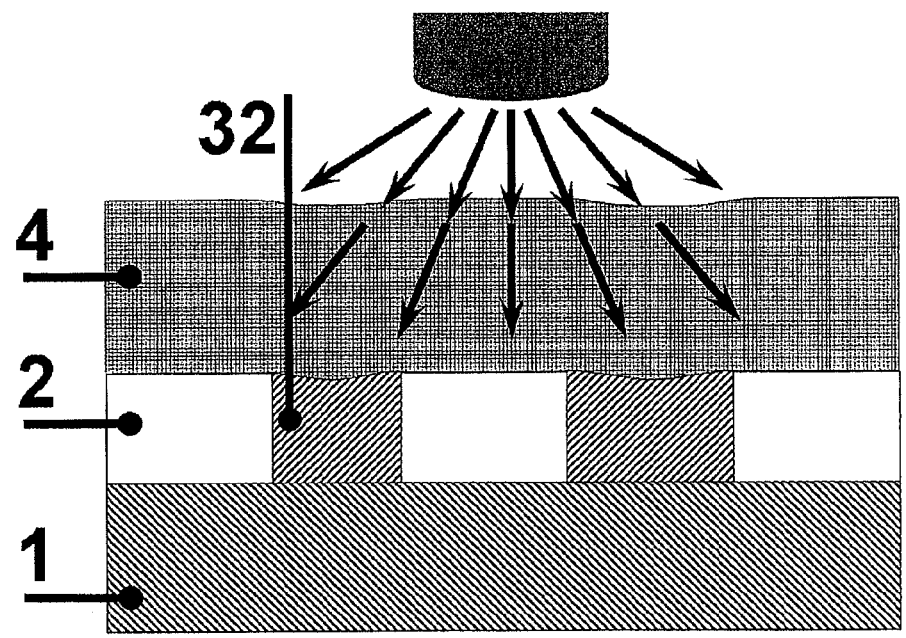
Fig.9E3

Fig.9E4

METHOD FOR THE PRODUCTION OF PLANAR STRUCTURES

CROSS REFERENCE TO RELATED APPLICATIONS

This application claims priority under 35 U.S.C. §119(e) to U.S. provisional patent application 60/831,957 filed on Jul. 18, 2006, which application is hereby incorporated by reference in its entirety.

BACKGROUND OF THE INVENTION

1. Field of the Invention

The present invention relates to the field of microelectronics. It relates to the field of the production of planar structures.

2. Description of the Related Technology

A typical electrostatic capacitive RF-MEMS device shown in FIG. 1 comprises a free-standing metal armature 100, hereafter called bridge, overlapping with a fixed metal actuation electrode 102. The actuation electrode 102 is covered with a dielectric layer 104 that is contacted upon actuation of the device.

When designing such a structure, various parameters have to be taken into account. Some parameters are listed in Table 1.

TABLE 1

| Design parameters for an RF-MEMS device | |
| --- | --- |
| Spring constant | k |
| Resonance frequency | $f_{res}$ |
| Pull-in voltage | $V_{PI}$ |
| Pull-out voltage | $V_{PO}$ |
| Up-state capacitance | $C_{up}$ |
| Down-state capacitance | $C_{down}$ |

The parameters k, $f_{res}$, $V_{PI}$ and $V_{PO}$ are linked to the actuation of the device while the parameters $C_{UP}$ and $C_{DOWN}$ are linked to the RF-application.

In practice, the parameters listed in Table 1 are not properly defined. The realized devices have inconsistent resonance frequencies, pull-in and pull-out voltages that can be related to an inconsistent spring constant of the armature. While $C_{up}$ is in general reasonably defined in case of clamped-clamped armatures, i.e. bridge 100, $C_{down}$ is constantly ill-defined, i.e. much lower than its target value. These uncertainties can all be related to an uncertain definition of the shape of the bridge 100.

The definition of $C_{down}$ for example is representative of the contact quality between the actuated bridge 100 and the underlying fixed dielectric layer 104. At the micro-level, this contact quality is degraded by the roughness of the dielectric layer 104 and of the bridge 100 [X. Rottenberg, H. Jansen, P. Fiorini, W. De Raedt and H. A. C. Tilmans, "Novel RF-MEMS capacitive switching structures", proc. 32nd European Microwave Conference, pp. 809-812, Milan, Italy, 23-27 Sep., 2002]. At the macro-level, the intimate contact between bridge 100 and dielectric layer 104 is degraded by the non-planarity of the bridge layer as shown in FIG. 2 [U.S. patent application US-2003/129843, Cai, Y. and Katehi L. P. B. "Planarizing recess etch"]. This macro-non-planarity is due to the poor topography absorption of the sacrificial layer used as a support for the bridge layer.

To obtain an intimate contact between bridge 100 and dielectric layers 104 when the device is closed, the bridge 100 may not touch anything on its way down before it touches the surface of the dielectric layer 104. The uncontrolled non-planarity of the armature 100 allows for parasitic contacts at the edge of the actuation electrode 102 or at the edge of any profile lying under the bridge layer. These can stop the bridge 100 on its way towards the dielectric 104 and prevent the good definition of $C_{down}$ as demonstrated by Yu, et al. in "Improvement of isolation for MEMS capacitive switch via membrane planarisation".

In order to define a predictable technology, a process flow offering consistently flat bridges is clearly preferred. A second choice, fall-back and less preferred, would be a process flow that defines bridges with the inverse profile of the underlying topography, i.e. hills above valleys.

Currently, relying only on the topography absorption of the sacrificial layer forces to limit the thickness of the layers under the bridges to a few hundreds of nanometers what introduces large conductive losses at low frequencies, i.e. in the few GHz range.

Further, flat bridges (or with controlled profile) are much easier to model as their k, $f_{res}$, $V_{P1}$ and $V_{PO}$ are better defined.

Several planarization improvement schemes have already been proposed. A first scheme for planarizing the bridges is to deposit a bloc of sacrificial layer in the valleys of the existing topographies before applying the actual sacrificial layer and defining the bridges. The total sacrificial layer is thus deposited in 2 steps. To do that, a special mask has to be used. The alignment and definition of the "filling layer", i.e. that part of the sacrificial layer filling the valleys between the topographies, are critical. In practice, it is impossible to fully fill the valleys as a few microns misalignment always have to be allowed in order for the filling layer to fit in the valleys.

The main improvement brought by this solution is that the gap to be filled is standardized. Any valleys, designed for example for RF purpose, will be transformed by gap-filling into a standard for example 5 micron wide gap defined by the process accuracy. The process flow further relies on the aptitude of the actual sacrificial layer to planarize this gap.

A typical process flow for this technique is shown in FIG. 3 taken from Yu, et al. "Improvement of isolation for MEMS capacitive switch via membrane planarisation".

A second scheme proposed by Cai and Katehi [US-2003/129843] is to embed the underlying profile in the substrate before depositing the sacrificial layer and bridges, as shown in FIG. 4.

The advantage of this technique is that the same mask can be used to etch the holes in the substrate and to deposit the underlying profiles, e.g. CPW lines (CoPlanar Waveguide), mimicking a lift off deposition process. This deposition delivers almost flat wafers. Nevertheless, parasitic gaps still remain. This time, there is no misalignment but well an undercut of the substrate due to the process used to define the holes.

Of course this technique relies on the accurate patternability of the substrate. This is not obvious in the case of glass wafers for example, often used for RF circuitry. Further, in the case of Si or other lossy substrates, the embedding of the lines in the substrate is not a preferred situation for what the losses concerns.

It is further not obvious whether this technique offers really a solution to the $C_{down}$ definition problem as even perfectly flat bridges could be stopped by the remaining substrate studs protruding above the topography. The substrate is indeed in general not attacked by the sacrificial layer removal step.

The sacrificial layer used in thin film MEMS devices is often a photosensitive polymer that is spun or sprayed on the wafer before the bridge definition. When this polymer is applied, it is in a fluid solution mixed with a solvent. During the spinning/spraying, the solvent evaporates, what changes the viscosity of the solution and thus its planarization characteristic. In a third scheme the step coverage of the sacrificial layer is improved by spraying on the sacrificial layer a small amount of solvent or by applying an appropriate temperature profile that allows the sacrificial layer to get temporarily more fluid and reflow it after its deposition. It works only partially. The sacrificial layer can form further lenticular shapes on the high areas due to the capillary forces.

A fourth scheme, based on Chemical Mechanical Polishing (CMP) is in principle the most straightforward. Reproducibly polishing a polymer sacrificial layer down to a controlled thickness is nevertheless rather difficult. Further, the price for implementing this technique is the too prohibitive for the major RF-MEMS and purely MEMS target applications.

It is thus desirable to provide for a method for producing of structures with a flat upper surface, which alleviates or avoids the problems of the prior art.

SUMMARY OF CERTAIN INVENTIVE ASPECTS

Certain inventive aspects provide a method for the production of a planar structure. The method comprises:
a. producing on a first main surface of a substrate a plurality of structures, the structures being of substantially constant and substantially equal height, and there being a space in between the plurality of structures;
b. providing a fill layer of photosensitive material substantially filling the space between the structures;
c. illuminating a portion of the fill layer with electromagnetic radiation, hereby producing an exposed portion and an unexposed portion, the exposed and unexposed portions being separated by at least one interface; and producing at least one level interface substantially parallel with the first main surface of the substrate, in the areas defined by the spaces between the structures projected substantially perpendicular to the first main surface of the substrate and at a predetermined height level above the substrate
d. removing the portion above the level interface, i.e. the portion at that side of the level interface which is away from the substrate, and if present, next to the interface.

This makes that no additional mask, and thus no additional alignment is needed, and that the alignment is thus perfect. The height of the filling block, i.e. portion of the fill layer remaining between the structures, can moreover be tuned.

The substrate can be, but is not limited to, AF45 glass, soda lime, pyrex, quartz, diamond, sapphire, High Resistivity or Low Resistivity Silicon (HRSi or LRSi), GaAs and other types of wafers. The substrate can also be laminate-based like a Rogers materials or a Liquid Crystal Polymer (LCP) substrate or further a High Temperature Cofired Ceramic (HTCC) or a Low Temperature Cofired Ceramic (LTCC).

The fill layer can be, but is not limited to, the Clariant AZ5214 photoresist, Kapton polyimide from Dupont, benzocyclobutene-based polymers (BCB) from Dow Corning, SU-8 from MicroChem and other so-called positive or negative photoresists.

The frequency of the electromagnetic radiation used ranges through the full electromagnetic spectrum. For example, Infrared, UV as well as deep X-ray radiations can be used. Further, several wavelengths can be used in combination with each other. In the case of commonly used photoresists, the high intensity UV light available from the aligner machines can be used as well as slightly modified process recipes already developed for these polymers.

Typical heights of the structures and spacings to be planarized are 0.1 micron, 0.3 micron, 1 micron, 10 micron, 100 micron, but can range from 50 nm to 10 cm depending on the application targeted and technology used.

Embodiments of these inventive aspects are relatively fast, cheap and accurate (self-alignment).

The height of the level interface may slightly vary, since the level interface may be not perfectly flat. The height of the level interface should then be seen as the average height of the level interface within the areas defined by the spaces between the structures projected substantially perpendicularly to the first main surface of the substrate.

In a first aspect of the present invention the exposed portion may be produced by illuminating a second main surface of the substrate with electromagnetic radiation of the predetermined frequency. The substrate is then preferably transparent or partially transparent to electromagnetic radiation of the predetermined frequency. The structures are preferably non transparent for the electromagnetic radiation. The unexposed portion of the fill layer is then removed, being the portion above and next to the interface between the exposed portion and the unexposed portion. The substrate can be, but is not limited to, AF45 glass, soda lime, pyrex, quartz, diamond, sapphire wafers in case visible light is used, High Resistivity or Low Resistivity Silicon (HRSi or LRSi), in case infrared radiation is used.

The non transparent structures can advantageously serve as a shadow mask during the illumination.

In a second aspect of the present invention, the exposed portion may be produced by illuminating the first main surface of the substrate with electromagnetic radiation of one or more predetermined frequencies; and wherein the exposed portion of the fill layer is removed.

The substrate is preferably absorbent, partially absorbent, transparent or partially transparent to electromagnetic radiation of the predetermined frequency or frequencies. Preferably reflection of the electromagnetic radiation on the substrate is less than the reflection thereof on the structures. The structures can be adapted for partially or totally reflecting the electromagnetic radiation of the predetermined frequency or frequencies.

The contrast of exposition is in this embodiment opposite to the one produced in the previous embodiment. The fill layer above the reflecting structures is indeed overexposed compared to the fill layer in the spacing between the structures. The contrast in exposition translates after exposure in a contrast of sensitivity to the removal of the fill layer. By an appropriate choice of the fill layer, fill layer thickness, illumination dose and removal process the exposed portion of the fill layer, the spacing between the structures remains filled after illuminating the fill layer and removing the illuminated or exposed portion of the fill layer.

The predetermined height level can be controlled by controlling the dose of the electromagnetic radiation of the one or more illumination frequencies, and the level interface may correspond to the interface between the exposed portion and the unexposed portion.

In embodiments according to the first and second aspect of the present invention, the predetermined height level may be controlled by controlling the dose of illumination, at least for certain illumination frequencies. The dose can be controlled by controlling for instance the intensity and duration of the electromagnetic radiation.

In some embodiments, the predetermined height level equals the height of the structures.

The predetermined height level can also extend slightly above the structures, as for instance less than 50 nm, 0.1 micron, 0.2 micron, 0.5 micron, 1 micron, 2 micron, 3 micron or for instance for less than 0.1%, 0.5%, 1%, 2%, 3%, 4%, 5%, 10%, 20% of the height of the surrounding structures.

In certain embodiments, in case of illumination from the second main surface of the substrate, the exposed portion can be mushroom-like shaped, having the hat of the mushroom extending sideways above the structures. If the hat is such that it can be described as the combination of essentially 2 surfaces, a flat lower surface and a curved upper surface; then the flat lower surface can coincide with the upper surface of the structures and the upper surface of the hat can extend above this surface.

The predetermined height level can also extend slightly below the structures as for instance less than 50 nm, 0.1 micron, 0.2 micron, 0.5 micron, 1 micron, 2 micron, 3 micron or for instance for less than 0.1%, 0.5%, 1%, 2%, 3%, 4%, 5%, 10%, 20% of the height of the surrounding structures.

In certain embodiments of the present invention, the predetermined height level is controlled by controlling the dose of the electromagnetic radiation and the level interface corresponds to the interface between the exposed portion and the unexposed portion.

The predetermined height level can also be controlled by controlling the application of the fill layer. The application of the fill layer can be controlled by controlling the spin-speed of spinnable fill layers.

The application of the fill layer can be controlled such that it substantially fills the space between the structures, and extends on the top surfaces of the structures only to a limited extent, such that the amount of fill material extending upwards out of the spaces between the structures is limited. The term "limited" should be seen in view of the required flatness of the resulting surface. In particular, the fill layer may extend on the top surfaces of the structures for instance less than 50 nm, 0.1 micron, 0.2 micron, 0.5 micron, 1 micron, 2 micron, 3 micron or for instance for less than 0.1%, 0.5%, 1%, 2%, 3%, 4%, 5%, 10%, 20% of the height of the surrounding structures.

In embodiments where illumination is performed from the second main surface of the substrate, or thus from the backside, the controlling of the illumination from the backside is not critical, since a full curing of the exposed fill layer can be performed up until the front surface of the fill layer is reached. In these embodiments the interface between the exposed portion and the unexposed portion can have a U-shaped envelope, or, with other words, the interface between the exposed portion and the unexposed portion can be essentially perpendicular to the substrate surface. In this case, only the portion of the fill layer present next to the interface between the exposed and unexposed portions will be removed. In a certain view the interface together with the level interface, here the top interface of the exposed fill layer, forms an exposed portion which has a crown-like shape, as illustrated in FIG. 10.

In embodiments according to the first and second aspect of the present invention, the illumination of a portion of the fill layer via the first main surface or via the second main surface may be substantially uniform.

The previously mentioned embodiments of the present invention can further comprise the production of a functional layer, for example a MEMS device, e.g. by deposition of a sacrificial layer on top of the structures and the remaining portion of the fill-layer, i.e. that portion of the fill layer which is not removed when removing the portion of the fill layer which is located, with respect to the level interface, away from the substrate. The sacrificial layer can be or can comprise the same material as the fill layer, such that removal of the remaining portion of the fill layer and the sacrificial layer is simplified.

In further embodiments the production of a functional layer on top of the sacrificial layer is comprised. The advantage of the embodiments according to the present invention is that a flatter functional layer can be achieved now. The topology of the functional layer is now decoupled of the topology of the underlying structures. A substantially flat functional layer can, in particular, be produced.

The functional layer can comprise a set of sublayers. It can be for instance, but not only, a piezoelectric layer in sandwich between electrode layers, mirror layers with reflective coating, (RF-)MEMS beams, membranes and in general freestanding structures with dielectric coating layers for further actuation or MCM-D fixed passives. The functional layer can be arranged to form a bridge or cantilever structure of a MEMS switch as for instance an RF-MEMS switch. The functional layer can be arranged to form a panel and torsional suspension structure of a tunable mirror.

The sacrificial layer can be removed after the production of the functional layer.

The structures produced on the first main surface of the substrate can be electrically conductive lines. These structures can be metal lines made for example of Cu, Ag, Au, Pd or Al lines. These structures can form CoPlanar Waveguide (CPW) lines, micro strip lines or in general interconnects.

The applicability of the embodiments according to the first and second aspect of the present invention is not limited to electrostatic capacitive RF devices only, but is also for example valid for any switching device and any actuation means. Piezoelectric ohmic DC relays, for instance, also require the accurate definition of their shape and of their contact areas.

BRIEF DESCRIPTION OF THE DRAWINGS

Presently preferred embodiments are described below in conjunction with the appended drawing figures, wherein like reference numerals refer to like elements in the various figures, and wherein:

FIGS. 3(a)-3(g) illustrate a typical process-flow for gap filling through sacrificial layer deposition;

FIGS. 9A-9E4 are diagrams illustrating one embodiment of a method for producing planar structures according to a second aspect of the present invention;

DETAILED DESCRIPTION OF CERTAIN INVENTIVE EMBODIMENTS

Figure 1:
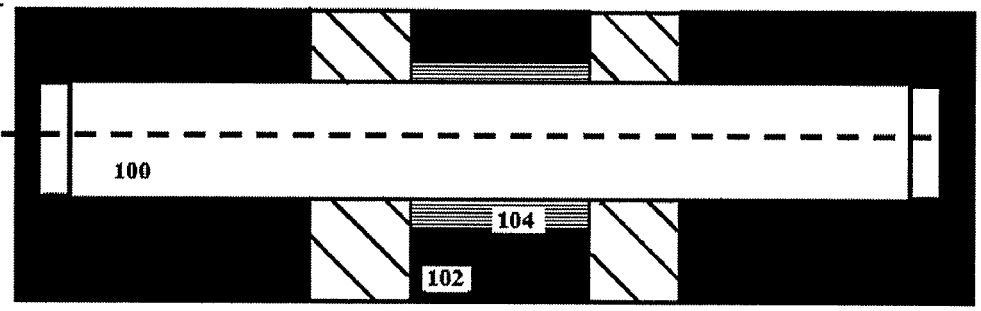
FIG. 1 is a diagram illustrating a known electrostatic capacitive RF-MEMS device.
Figure 1:
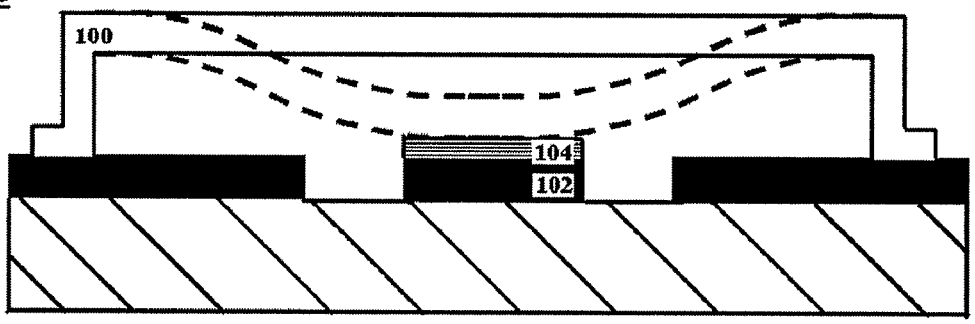
Figure 2:
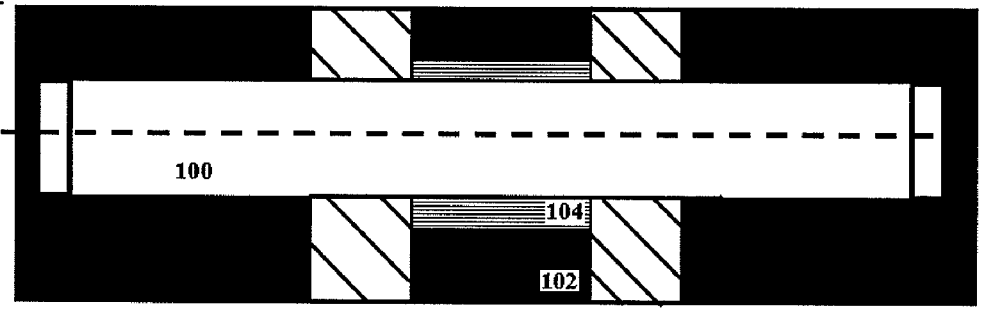
FIG. 2 is a diagram illustrating a known non-planarized electrostatic capacitive RF-MEMS device.
Figure 2:
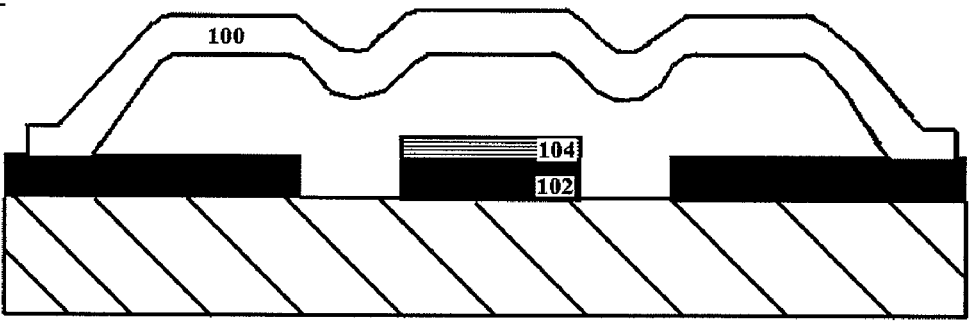
Figure 3:
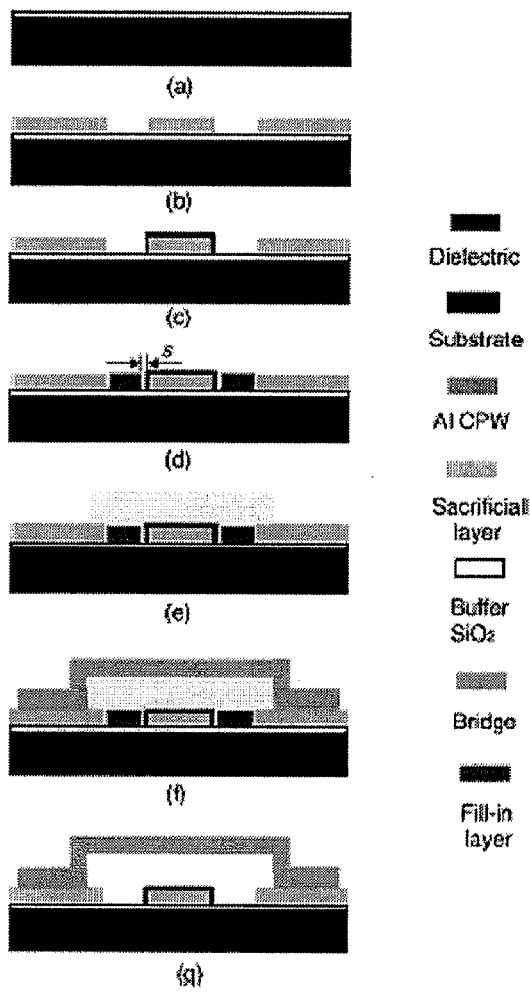
FIGS. 5 and 5A-5H3 illustrate one embodiment of a method for producing planar structures according to a first aspect of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Embodiments of the present invention use the reflectivity of the on-wafer topography to selectively polymerize a first sacrificial layer, i.e. e.g. a negative photoresist, with perfect alignment in the valleys of the topography.

An example of a first method according to embodiments of the present invention for creating a planarized or flat upper surface is illustrated in FIGS. 5 and 5A-5H3. The method comprises:
a) Production of a plurality of structures 2, e.g. a 1 micron thick pattern of Al, defined on a first main surface of a substrate 1, e.g. a glass substrate. The structures 2 are of substantially constant and substantially equal height. A space 5 is present between two neighboring structures 2.
b) Applying, e.g. spinning, a first fill layer 3 of electromagnetic radiation curable material, e.g. negative photoresist. The fill layer 3 substantially fills the space 5 between the structures 2.
c) Flipping the stack and placing it in an aligner (or under any suitable, powerful source of light). A suitable source of light is able to cure the fill layer 3.
d) Exposing the wafer, i.e. the substrate 1 with structures 2, from a second main surface of the substrate opposite to the first main surface, i.e. the backside, of the wafer in order to polymerize the fill layer 3 in the spaces 5, e.g. the slots of the Al pattern. This way, polymerized portions 29 and non-polymerized portions 30 are formed from the fill layer 3.
e) Flipping the wafer back "upside up". The fill layer 3 is developed and baked, thus forming exposed portions 31 and unexposed portions 32.
f) The unexposed portions 32 have been removed, leaving the spaces 5 or slots filled with exposed portions 31.
g) The sacrificial layer 4 is spun.
h) The sacrificial layer 4 is then exposed, developed and baked before the deposition and further processing of a device layer, e.g. for formation of a bridge.

Increased planarization by filling slots in between the structures 2, e.g. in CPW pattern, with negative resist exposed from the backside of the wafer has been achieved.

In one embodiment of the first method, the first fill layer 3 comprises positive photoresist material. The structures 2, e.g., CPW pattern, serve as a self-aligned mask when the first fill layer 3 is exposed to electromagnetic radiation from the backside of a transparent substrate.

In one embodiment of the first method, a metallic layer is deposited on the fill layer 3 before the wafer is exposed to electromagnetic radiation. The metallic layer is efficient against scattering of the electromagnetic radiation.

Figure 4:
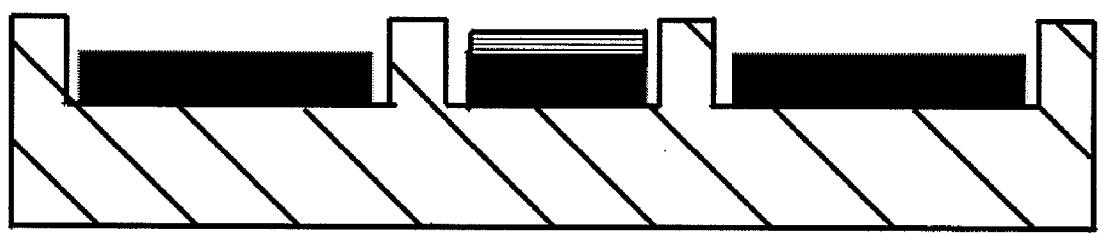
FIG. 4 is a diagram illustrating the cross-section of a known RF-MEMS device with a topography embedded in the substrate.
Figure 5:
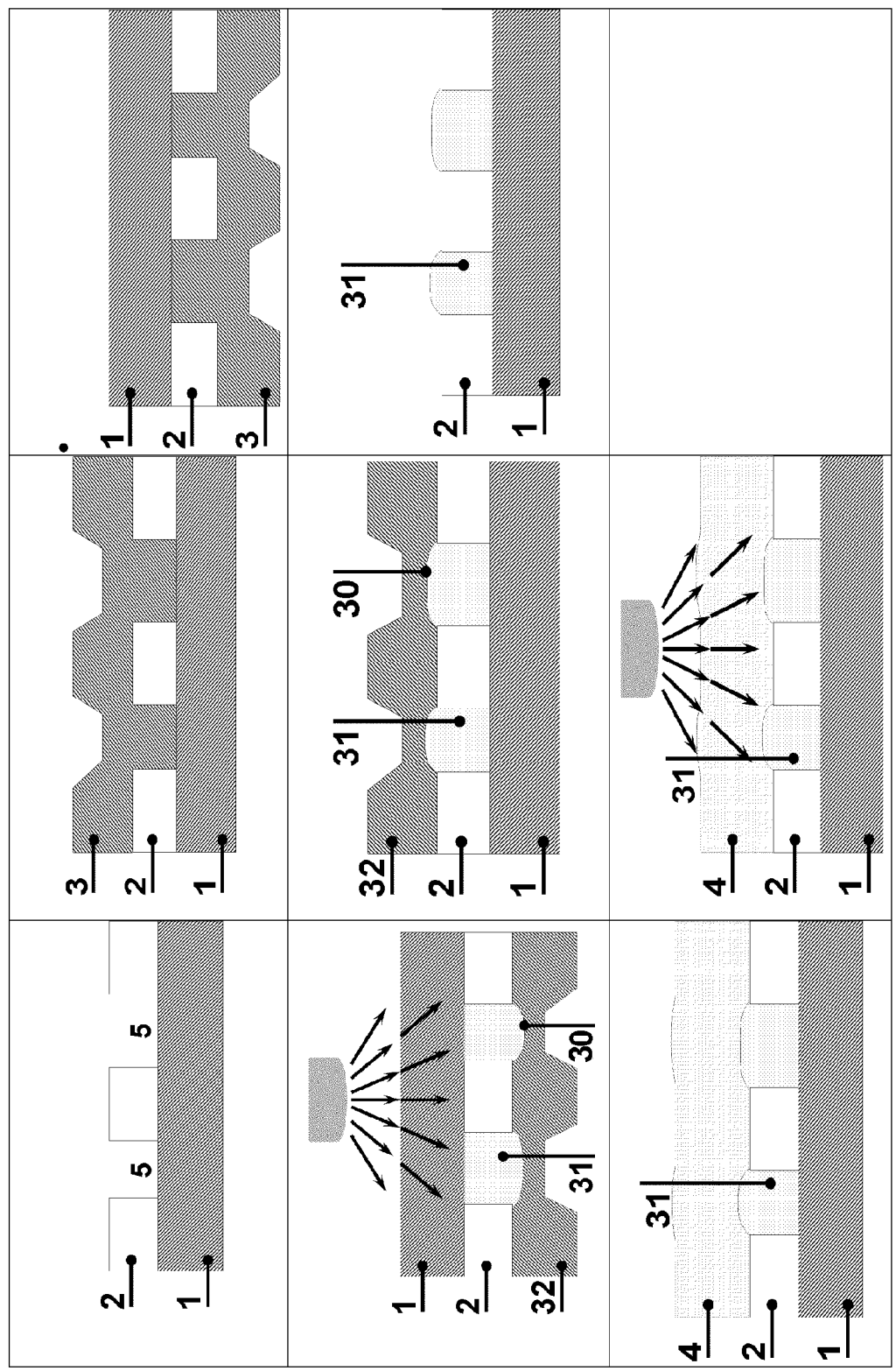
Figure 5A:
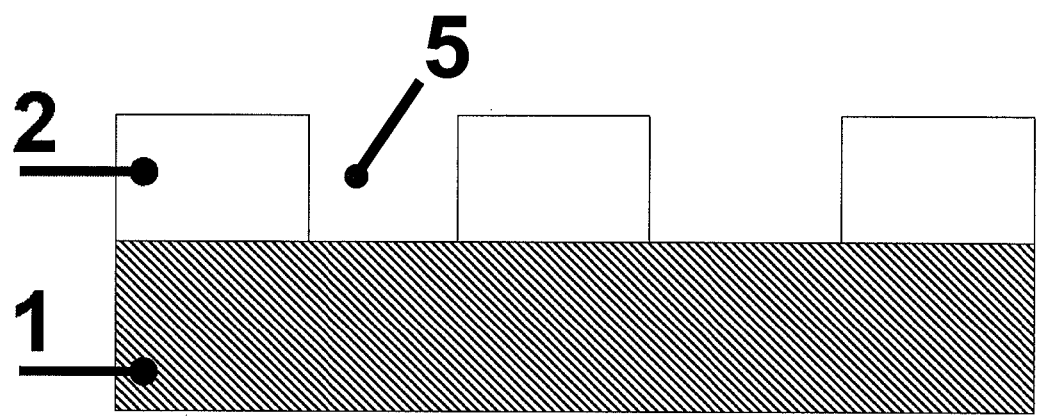
Figure 5B:
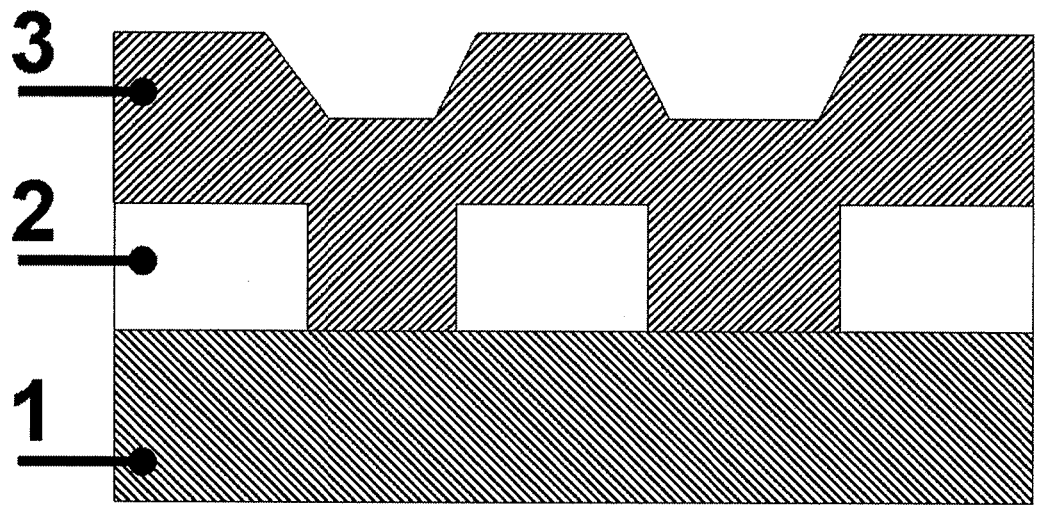
Figure 5C:
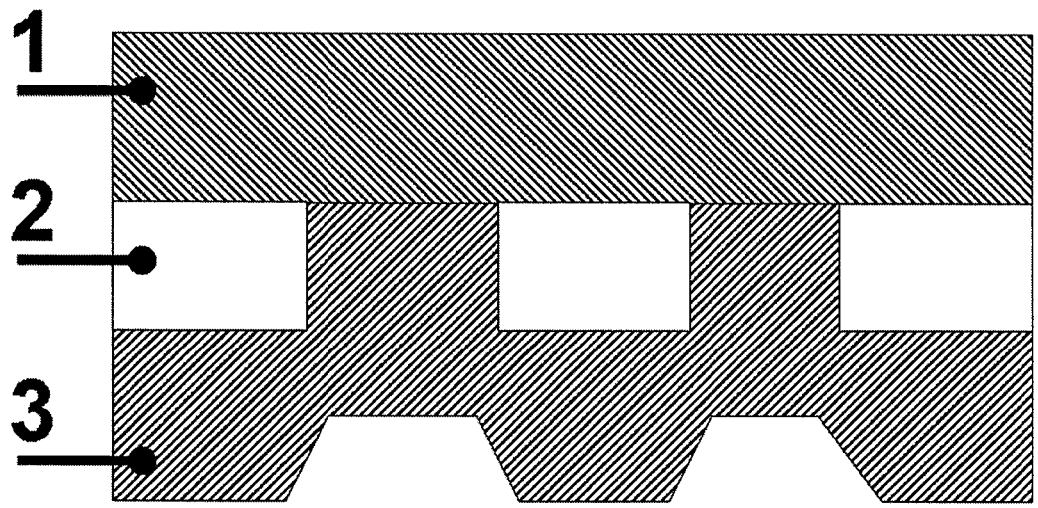
Figure 5E:
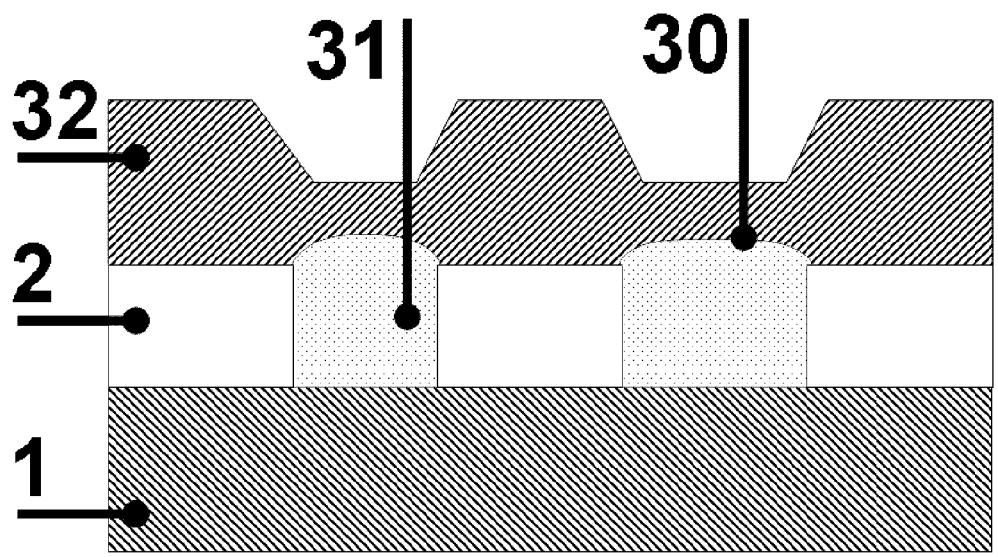
Figure 5F:
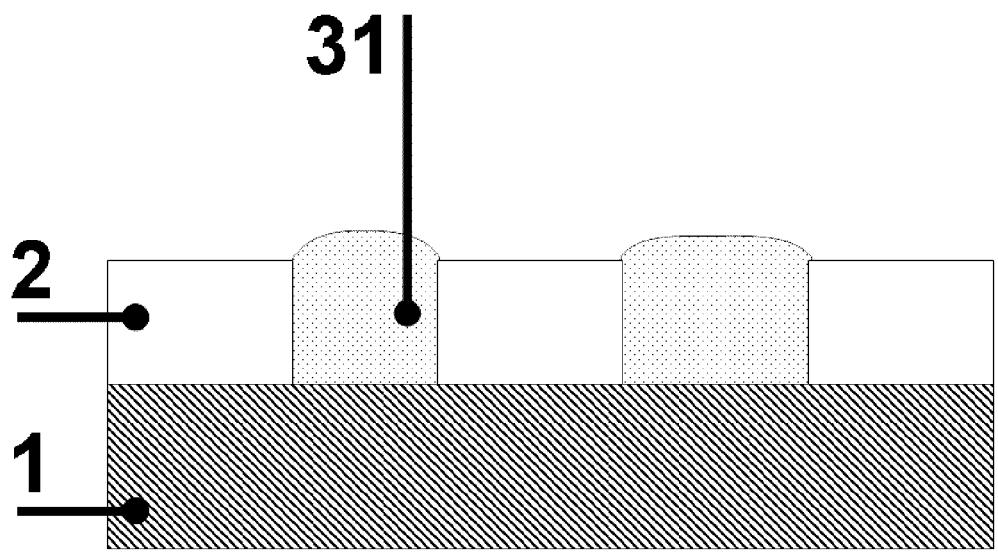
Figure 9A:
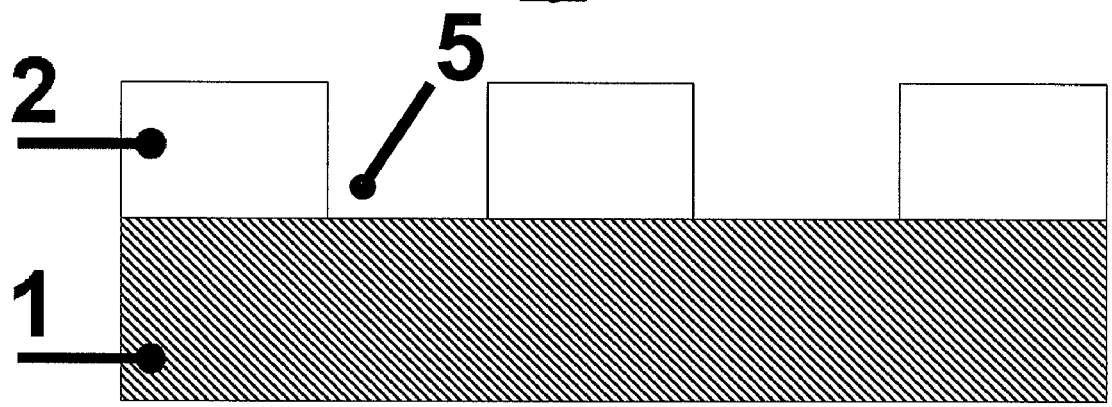
Figure 10A:
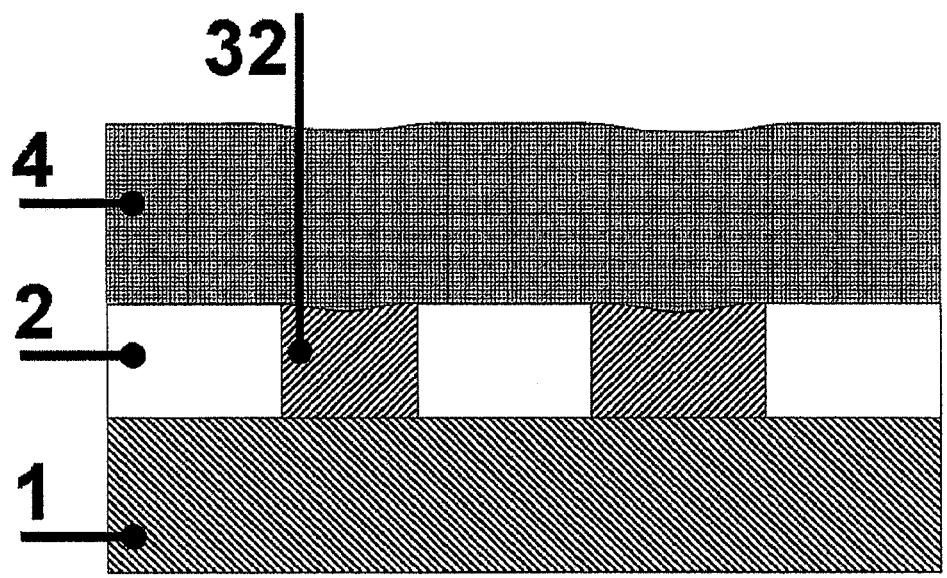
FIGS. 10A-10K are diagrams illustrating one embodiment of a method for producing planar structures according to the first aspect of the invention, wherein the height of the level interface is essentially controlled by controlling the application of the fill layer.
Figure 10A:
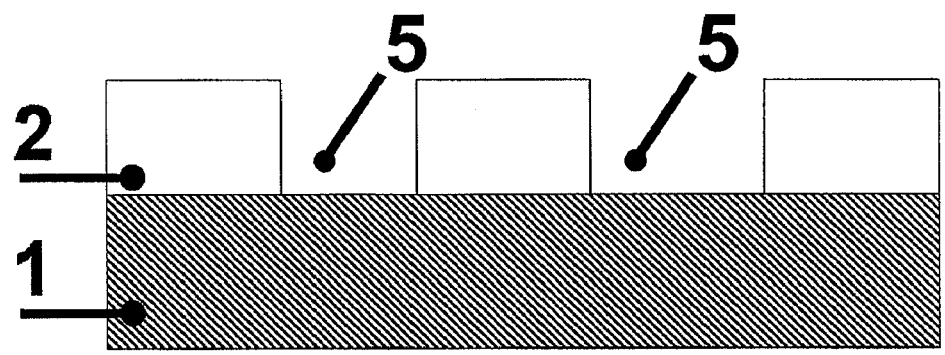
Figure 10B:
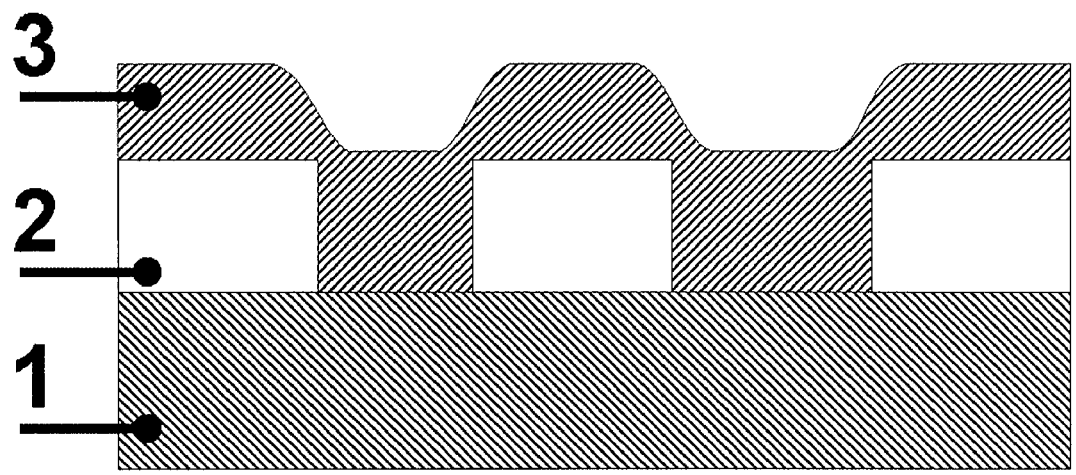
Figure 10C:
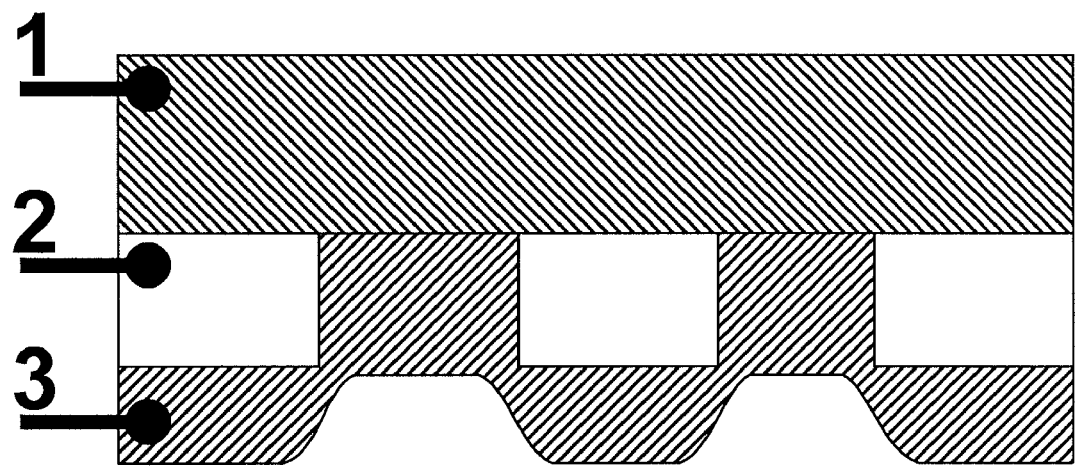
Figure 10D:
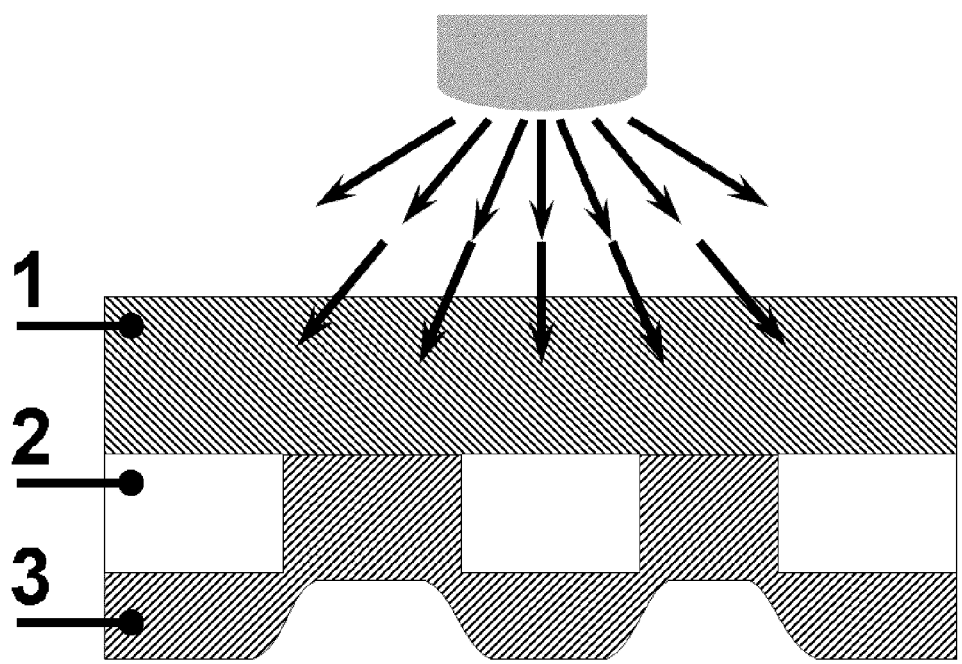
Figure 10E:
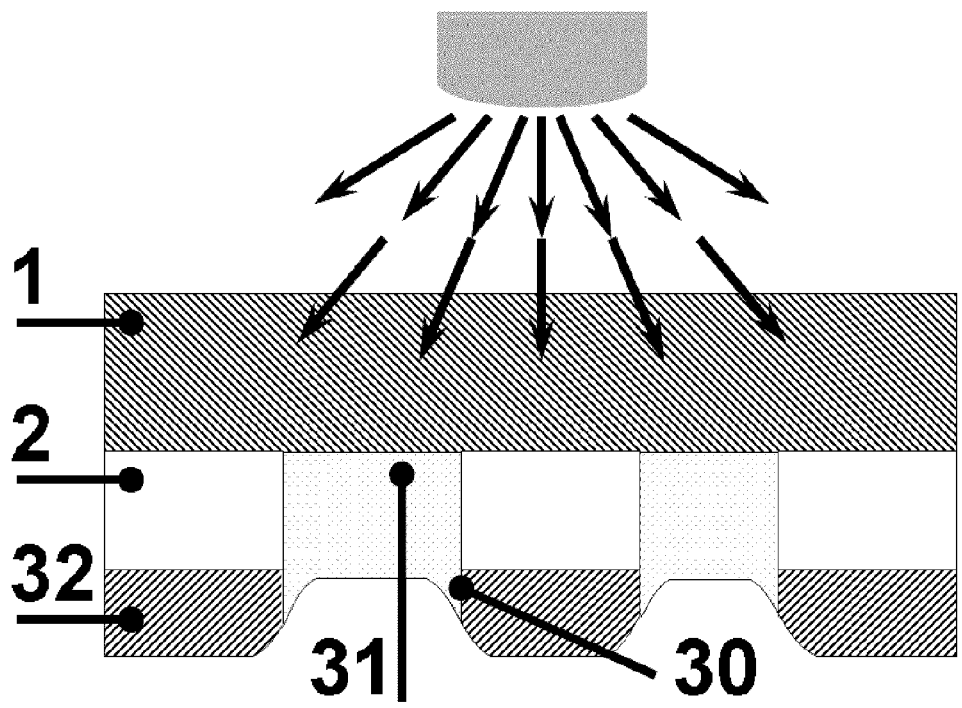
Figure 10F:
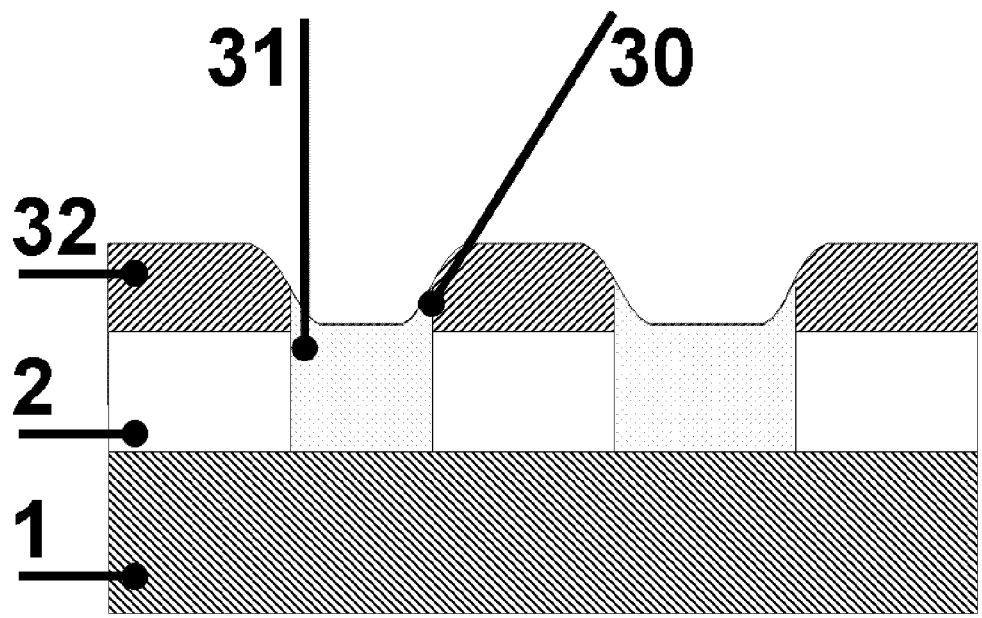
Figure 10G:
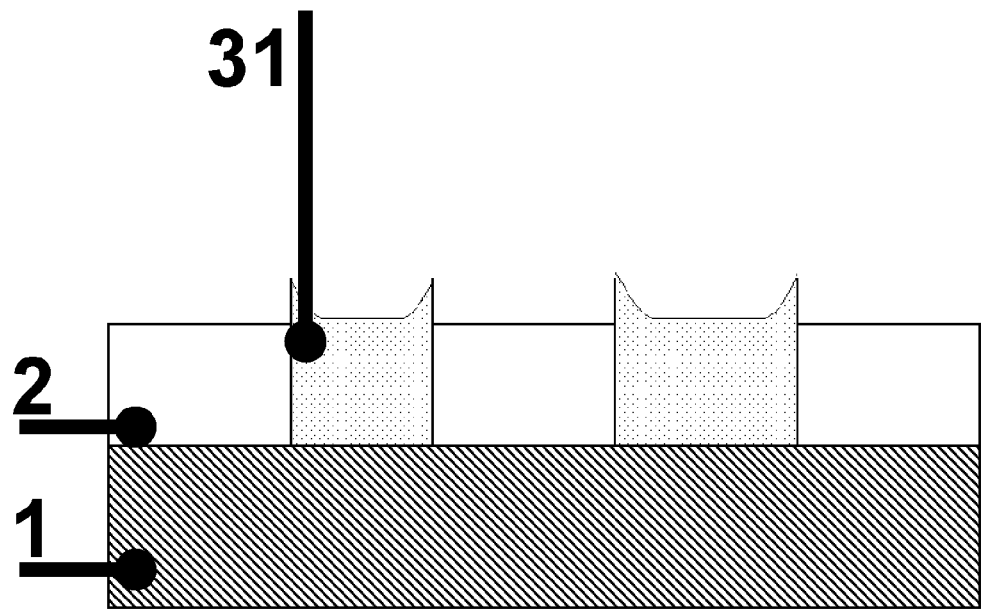
Figure 10H:
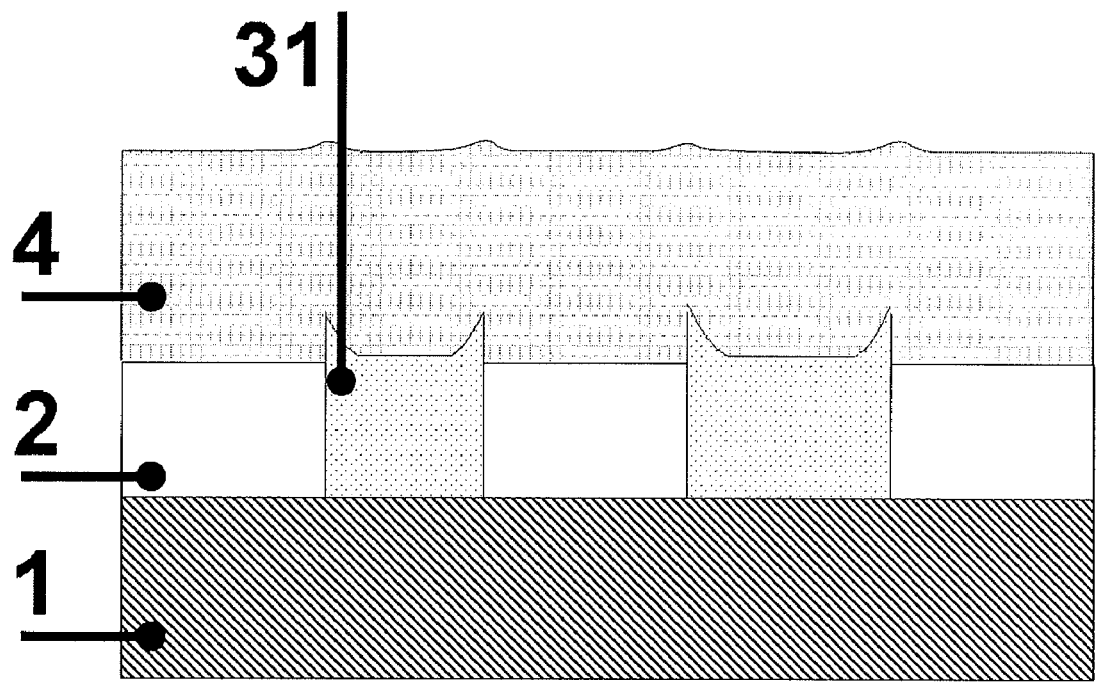
Figure 10I:
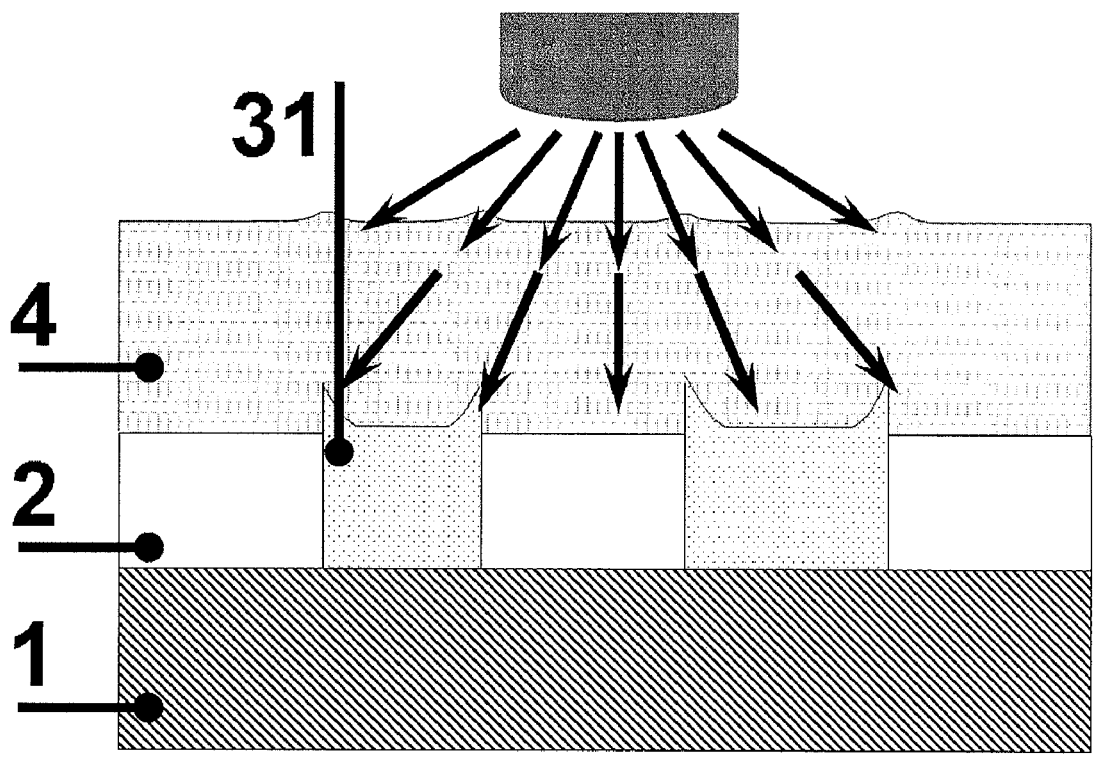
Figure 10J:
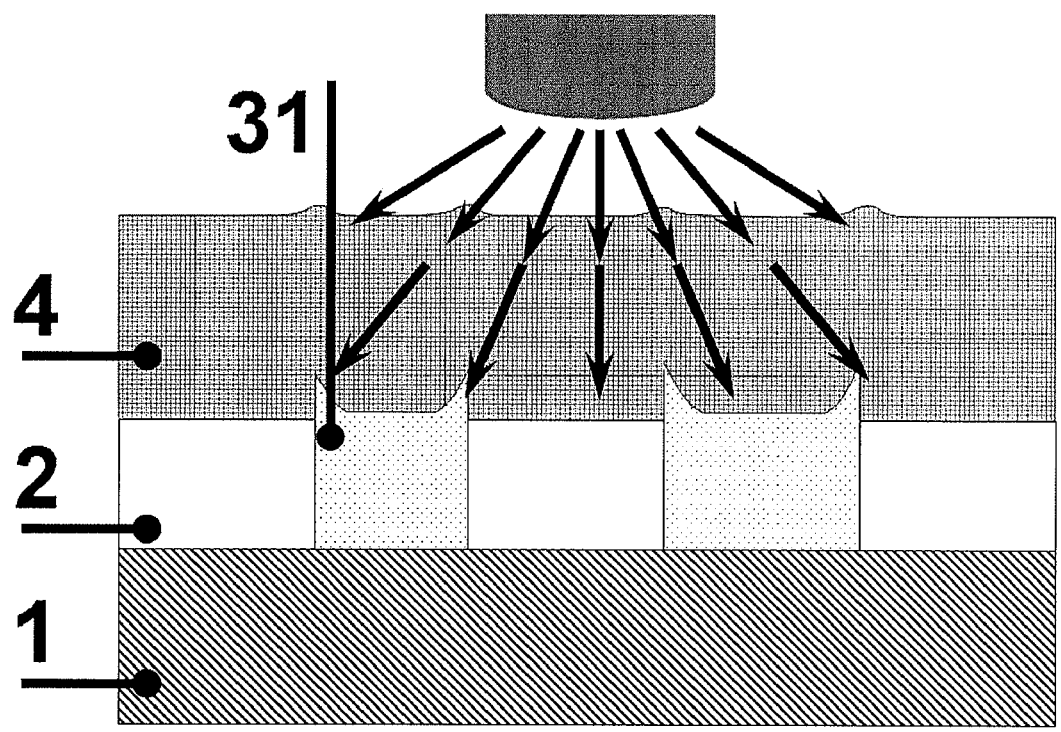
Figure 10K:
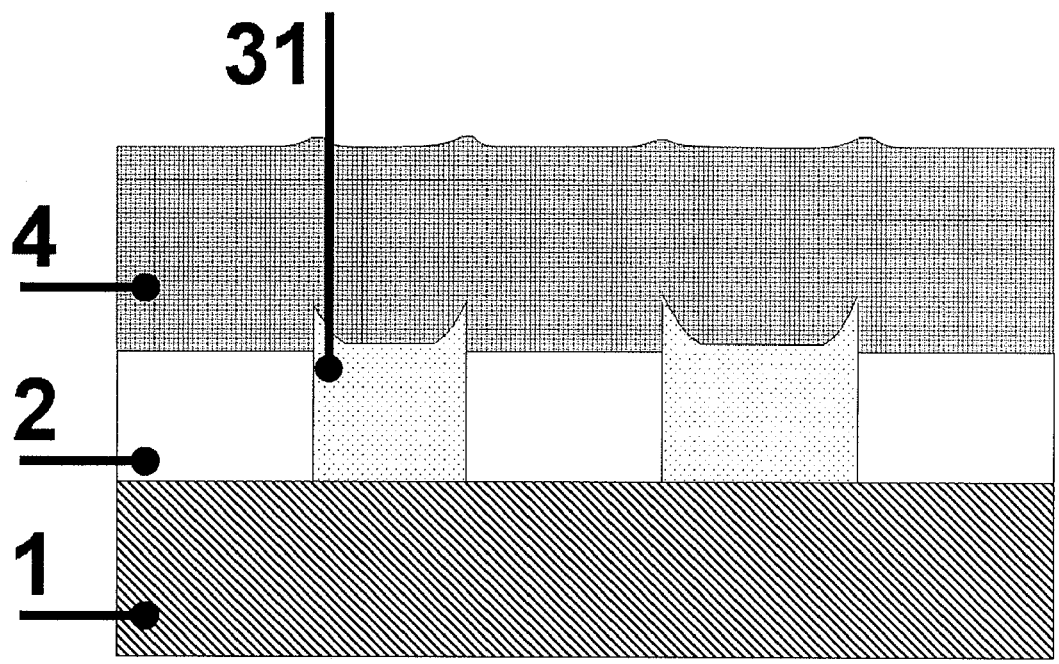

The use of a positive photoresist rather than a negative photoresist also allows using a front side exposure of the gap filling layer as shown in FIGS. 9A-9E4 and thus replaces the transparency condition of the substrate 1 by a condition on the reflectivity of the topography 2 to planarize.

An example of a second method according to embodiments of the present invention for creating a planarized or flat upper surface is illustrated in FIGS. 9A-9E4. The method comprises:
a) Definition of a plurality of structures 2, for example a thick pattern, for example 3 micron thick Al, on a first main surface of a general substrate 1. The structures 2 are of substantially constant and substantially equal height. A space 5 is present between two neighboring structures 2.
b) Providing, e.g. spinning, of a fill layer 3 of photosensitive material, e.g. positive photoresist. The fill layer 3 substantially fills the space 5 between the structures 2.
c) Electromagnetic radiation, e.g. light, is shone from the first main surface, i.e. the front side, of the wafer in order to decompose the fill layer 3 where it is exposed. The reflectivity of the structures 2, e.g. Al, enhances this effect where it is covered. Illuminated portions 29 an non-illuminated portions 30 of the fill layer 3 are generated.
d) The fill layer 3 is developed and optionally baked, thus forming exposed portions 32 and unexposed portions 31 (not shown, but corresponding to the illuminated portions 29) leaving the spaces 5 or slots filled ready for a further processing on a flattened topography.
e) A sacrificial layer 4 is spun substantially flat on top of the structures 2 and spaces 5 filled with exposed portions 32.
f) The sacrificial layer 4 is then exposed, developed and baked before the deposition and further processing of a device layer, e.g. for formation of a bridge.

Exemplary Results

Figure 6:
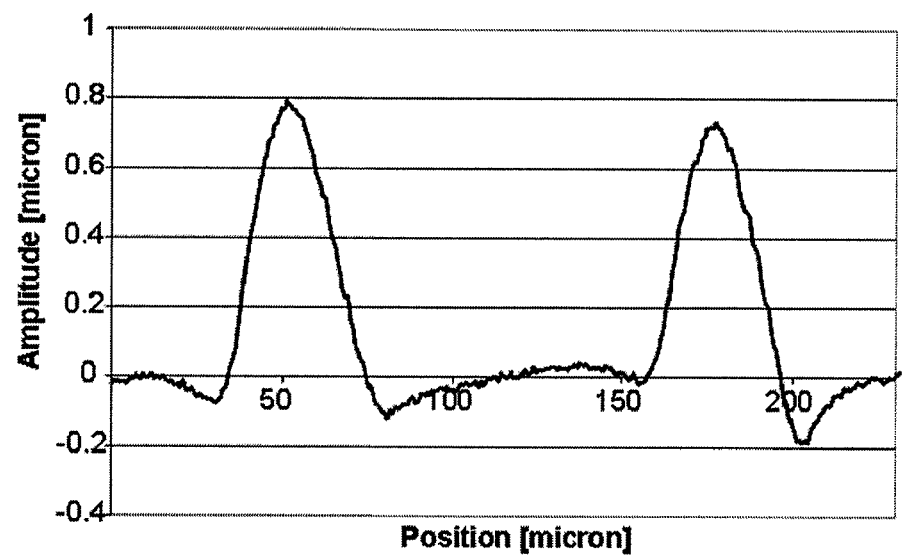
FIG. 6 illustrates an exemplary result of long exposure of the fill layer over 1 micron structures: $\Delta y=0.7$-$0.8$ micron upwards over the slot of a line after application of the second sacrificial layer.
Figure 6:
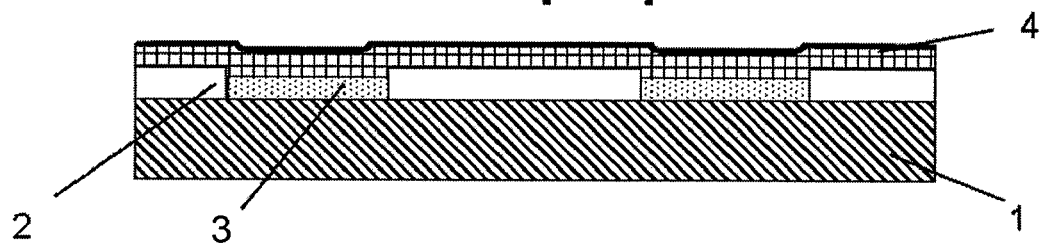

FIG. 6 illustrates an exemplary result of Al/Long exposure (750 mJ/cm$^2$) of the fill layer 3: step=0.7-0.8 micron upward over the slot 5 of a line 2 after application of the second sacrificial layer 4.
1. Production of a 1 micron thick pattern 2 of Al, defined on a AF-45 glass substrate 1.
2. Spinning a first fill layer 3 of Ma-N 420 Negative Tone resist of micro resist technology.
3. Flipping the stack 1, 2 and placing it in an aligner.

4. The wafer was exposed from the backside of the wafer in order to polymerize the fill layer 3 in the slots of the A1 pattern 2. Dose 750 mJ/cm²
5. The wafer was flipped back "upside up".
6. The fill layer 3 was developed in a Na-OH-based developer and baked leaving the slots 5 filled.
7. An 3 micron AZ6632 sacrificial layer 4 provided by Clariant is spun.

This results in a upward step of 0.7-0.8 micron over the slot of a line.

Figure 7:
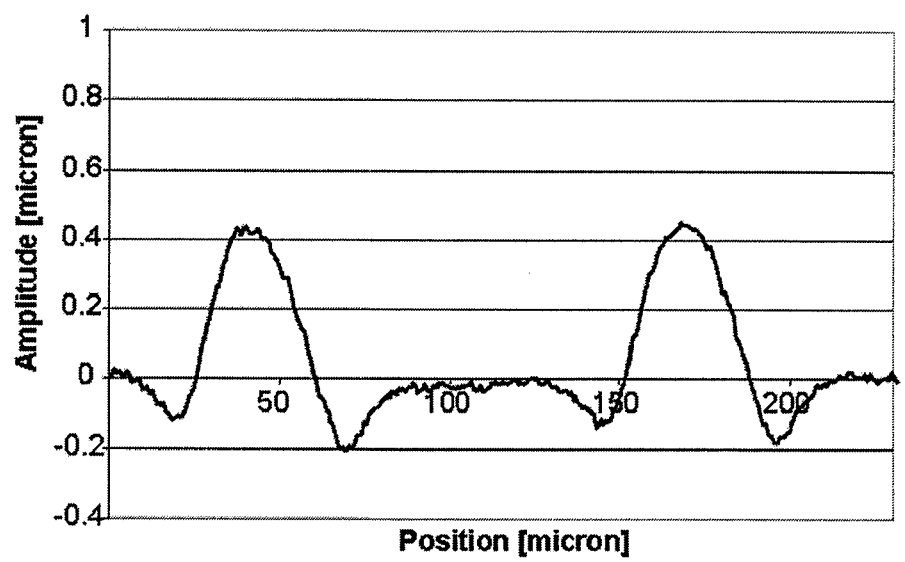
FIG. 7 illustrates an exemplary result of medium exposure of the fill layer over 1 micron structures: $\Delta y=0.4$ microns upwards over the slot of a line after application of the second sacrificial layer.
Figure 7:
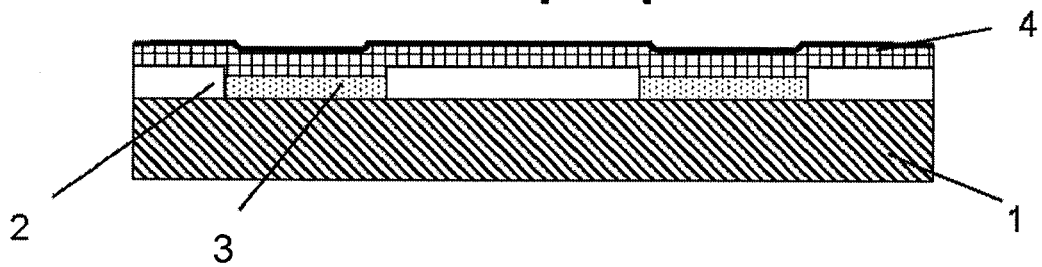

FIG. 7 illustrates an exemplary result of A2/Medium exposure (750 mJ/cm²) of the fill layer 3: step=0.4 micron upward over the slot 5 of a line 2 after application of the second sacrificial layer 4.

1. Production of a 1 micron thick pattern 2 of A1, defined on a AF-45 glass substrate 1.
2. Spinning a first fill layer 3 of Ma-N 420 Negative Tone resist of micro resist technology.
3. Flipping the stack 1, 2 and placing it in the aligner.
4. The wafer was exposed from the backside of the wafer in order to polymerize the fill layer 3 in the slots 5 of the A1 pattern 2. Dose 500 mJ/cm²
5. The wafer was flipped back "upside up".
6. The fill layer 3 was developed in a Na-OH-based developer and baked leaving the slots 5 filled.
7. An 3 micron AZ6632 sacrificial layer 4 provided by Clariant is spun.

Figure 8:
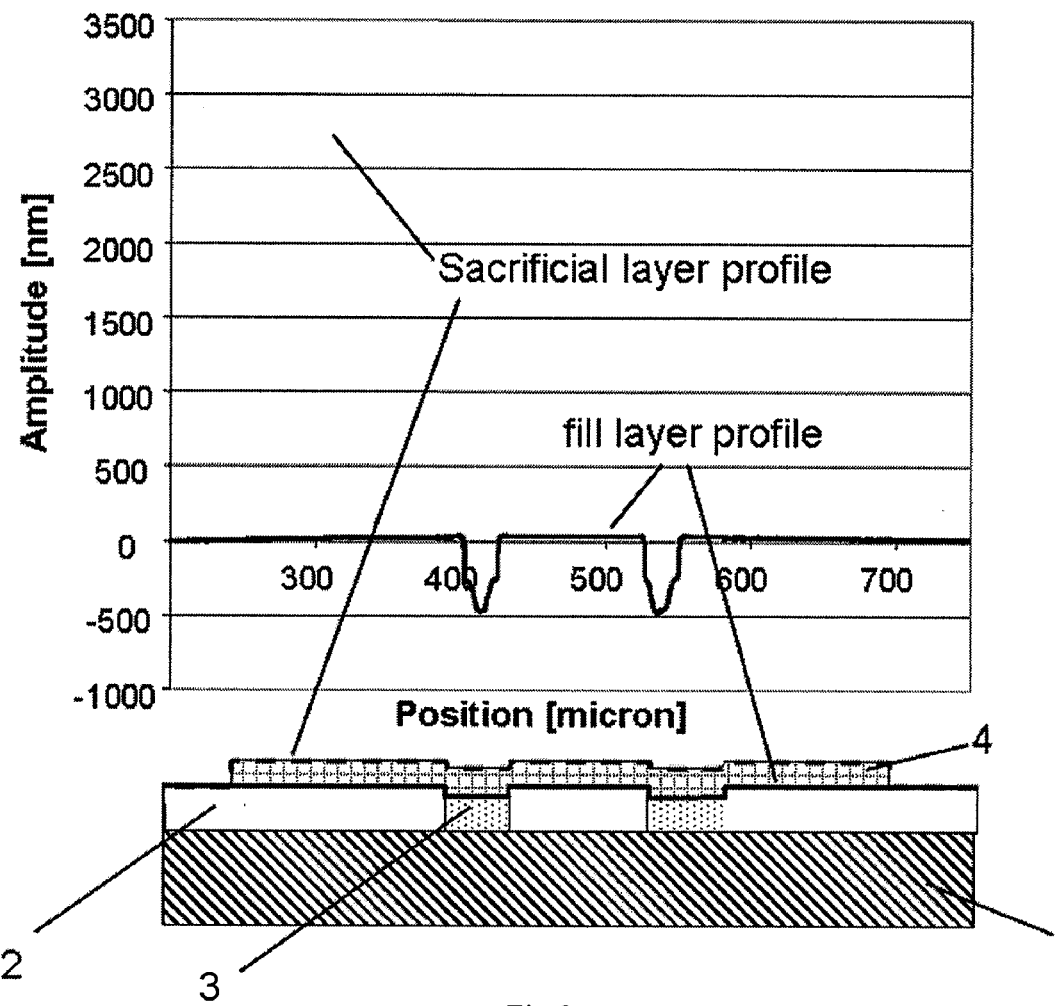
FIG. 8 illustrates an exemplary result of long exposure of the fill layer over 2 micron structures: $\Delta y=0.4$ microns downward over the slot of a line after application of the second sacrificial layer.

FIG. 8 illustrates an exemplary result of A3/Long exposure (750 mJ/cm²) of the fill layer 3 over 2 micron TiCuTi pattern: step=0.4 micron downward over the slot 5 of a line 2 after application of the second sacrificial layer 4.

1. Production of a 2 micron thick pattern 2 of TiCuTi, defined on a AF-45 glass substrate 1.
2. Spinning a first fill layer 3 of Ma-N 420 Negative Tone resist of micro resist technology.
3. Flipping the stack and placing it in an aligner.
4. The wafer was exposed from the backside of the wafer in order to polymerize the fill layer 3 in the slots 5 of the TiCuTi pattern. Dose 750 mJ/cm²
5. The wafer was flipped back "upside up".
6. The fill layer 3 was developed in a Na-OH-based developer and baked leaving the slots 5 filled.
7. A 3 micron AZ6632 sacrificial layer 4 provided by Clariant is spun, exposed and developed in Na-OH based developer.

Figure 11:
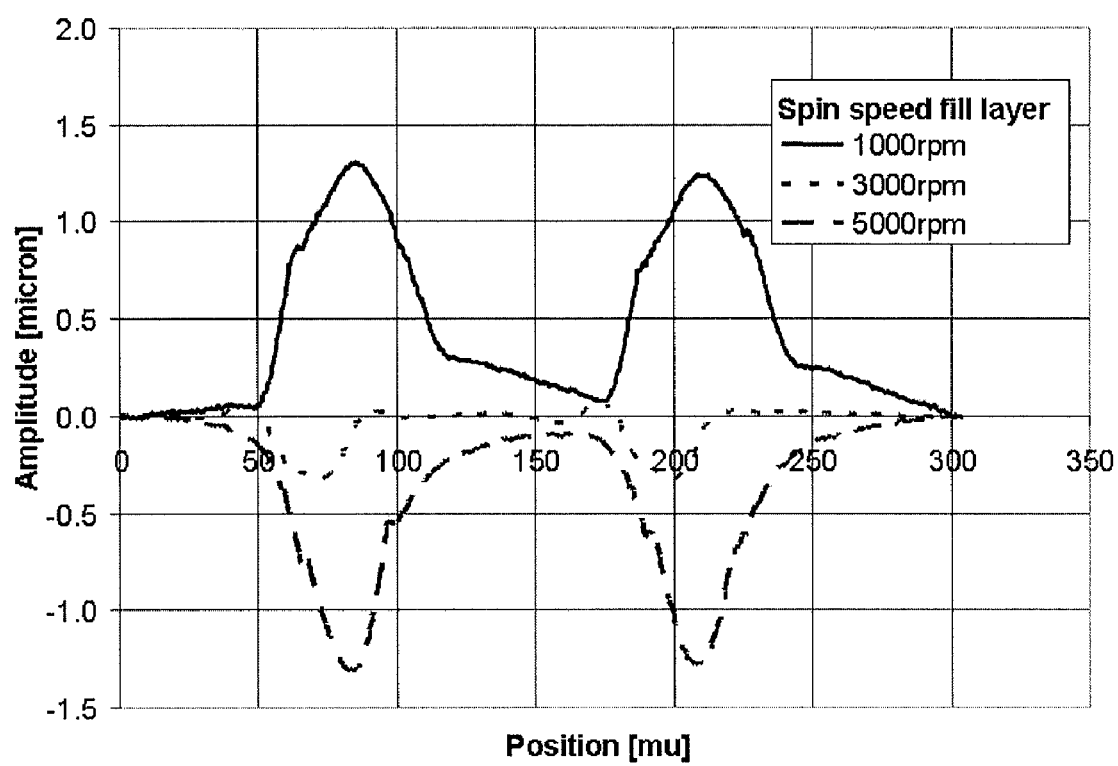
FIG. 11 illustrates amplitude/position plots for the flattened topologies according to the method in FIGS. 10A-10K, for different spin speeds for providing the fill layer.

FIGS. 10A-10K are diagrams illustrating one embodiment of a method for producing planar structures according to the first aspect of the invention, wherein the height of the level interface is essentially controlled by controlling the application of the fill layer; FIG. 11 illustrates amplitude/position plots for the flattened topologies according to the method in FIGS. 10A-10K, for different spin speeds for providing the fill layer.

FIGS. 10A-10K illustrate results of "through-curing" wherein the height of the level interface (00) is controlled by controlling the application of the fill layer. Variation of fill layer thickness. (1200 mJ/cm²) of the filling layer: step between 1.2 micron downward and 1.2 micron upward over the slot of a line after application of the second sacrificial layer.

1. Production of a 2 micron thick pattern 2 of A1, defined on an AF-45 glass substrate 1.
2. Spinning a first filling layer 3 of AZ5214E image reversal resist of Clariant. The spin speed is used as a parameter that can be varied to change the thickness of the fill layer. A spin speed of 100 rpm, 300 rpm and 5000 rpm result in a uniform film thickness of 2.9μ, 1.6μ and 1.3μ.
3. Flipping the stack and placing it in the aligner.
4. The wafer was exposed from the backside of the wafer in order to polymerize the filling layer 3 in the slots 5 of the A1 pattern. Dose 12000 mJ/cm²
5. The wafer was flipped back "upside up".
6. The wafer was cured, the so-called inversal bake.
7. The wafer was exposed from the front side.
8. The filling layer was developed in a Na-OH-based developer and baked, leaving the slots filled.
9. A 3 micron AZ6632 sacrificial layer provided by Clariant is spun.

In the resulting profiles a clear dependency of the final profile on the spin speed of the fill layer can be observed.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of producing a planar structure, comprising:
   a. producing on a first main surface of a substrate a plurality of structures, the structures being of substantially equal height, there being a space in between the plurality of structures;
   b. providing a fill layer of photosensitive material substantially filling the space between the structures;
   c. illuminating a portion of the fill layer with electromagnetic radiation so that the filler layer has one exposed portion and one unexposed portion, the exposed portion and unexposed portion being separated by a level interface substantially parallel with the first main surface of the substrate at a predetermined height level above the substrate;
   d. removing one of the unexposed portion and the exposed portion which is above the level interface so that, the rest of the fill layer and the plurality of structures form a planarized surface.

2. The method of claim 1, wherein the substrate is transparent to the electromagnetic radiation and wherein the structures are non transparent for the electromagnetic radiation, and wherein the exposed portion is produced by illuminating a second main surface of the substrate with electromagnetic radiation, and wherein the unexposed portion of the fill layer is removed.

3. The method of claim 1, wherein the exposed portion is produced by illuminating the first main surface of the substrate with electromagnetic radiation of one or more predetermined frequencies, and wherein the exposed portion of the fill layer is removed.

4. The method of claim 1, wherein the predetermined height level equals the height of the structures.

5. The method of claim 1, wherein the predetermined height level extends slightly above the structures.

6. The method of claim 1, wherein the predetermined height level extends slightly below the structures.

7. The method of claim 1, wherein the predetermined height level is controlled by controlling the dose of the electromagnetic radiation.

8. The method of claim 1, wherein the predetermined height level is controlled by controlling the application of the fill layer.

9. The method of claim 1, wherein the illuminating of a portion of the fill layer is substantially uniform.

10. The method of claim 1, further comprising depositing a sacrificial layer on top of the structures and the remaining portion of the fill-layer.

11. The method of claim 1, wherein the structures are electrically conductive lines.

12. The method of claim 2, wherein the non transparent structures serve as a shadow mask during the illuminating.

13. The method of claim 3, wherein the predetermined height level is controlled by controlling the dose of the electromagnetic radiation.

14. The method of claim 13, wherein the structures are adapted for reflecting the electromagnetic radiation of the one or more predetermined frequencies.

15. The method of claim 5, wherein the exposed portion is mushroom-like shaped.

16. The method of claim 8, wherein the application of the fill layer is controlled such that it substantially fills the space between the structures, and extends on the top surfaces of the structures only to a limited extent, such that the amount of fill material extending upwards out of the spaces between the structures is limited.

17. The method of claim 8, wherein the exposed portion is crown-like shaped.

18. The method of claim 10, further comprising the production of a functional layer on top of the sacrificial layer.

19. The method of claim 18, wherein the functional layer comprises a set of sublayers.

20. The method of claim 18, wherein the functional layer is arranged to form a bridge or cantilever structure of a MEMS switch.

21. The method of claim 18, wherein the functional layer is arranged to form a panel and torsional suspension structure of a tunable mirror.

22. The method of claim 18, further comprising removing the sacrificial layer.

23. The method of claim 18, wherein the functional layer comprises a planar structure.

24. The method of claim 11, wherein the structures are metal lines.

25. The method of claim 24, wherein the structures form a CPW line (coplanar waveguide).

26. A method of producing a planar structure, comprising:
forming on a first main surface of a substrate a plurality of structures, the structures being of substantially the same height and being separated by at least a space;
filling substantially the whole space between the structures with a fill layer of photosensitive material;
illuminating a portion of the fill layer with electromagnetic radiation such that the fill layer after the illumination has one exposed portion and one unexposed portion separated by an interface, the interface being substantially parallel with the first main surface of the substrate and at a level above the substrate approximately equal to the height of the structures, the unexposed portion being above the interface; and
removing the unexposed portion of the fill layer so that the exposed portion of the fill layer and the plurality of structures form a planarized surface.

27. The method of claim 26, further comprising depositing a metallic layer on the filler layer prior to illumination.

28. The method of claim 26, wherein, prior to the illuminating of the fill layer, the fill layer is the top layer on the first main surface of the substrate.

29. The method of claim 26, further comprising:
depositing a sacrificial layer on top of the structures; and
forming a functional layer on top of the sacrificial layer.

30. The method of claim 26, wherein the substrate is transparent to the electromagnetic radiation and wherein the structures are non transparent for the electromagnetic radiation, and wherein the exposed portion is produced by illuminating a second main surface of the substrate with electromagnetic radiation.

31. The method of claim 26, wherein the exposed portion is produced by illuminating the first main surface of the substrate with electromagnetic radiation of one or more predetermined frequencies.

32. A semiconductor device comprising a planar structure formed by the method of claim 26.

33. The method of claim 26, further comprising, subsequent to the removing of the unexposed portion of the fill layer, depositing a sacrificial layer on top of the structures and the remaining portion of the fill-layer.

34. The method of claim 33, further comprising the production of a functional layer on top of the sacrificial layer.

35. The method of claim 34, further comprising removing the sacrificial layer.

36. The method of claim 34, wherein the functional layer comprises a planar structure.

* * * * *